(12) United States Patent
Kang

(10) Patent No.: US 12,324,111 B2
(45) Date of Patent: Jun. 3, 2025

(54) DEFORMABLE DISPLAY DEVICE FOR VEHICLE

(71) Applicant: LG ELECTRONICS INC., Seoul (KR)

(72) Inventor: Seongbin Kang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 224 days.

(21) Appl. No.: 18/214,032

(22) Filed: Jun. 26, 2023

(65) Prior Publication Data

US 2024/0010069 A1 Jan. 11, 2024

(30) Foreign Application Priority Data

| Jul. 6, 2022 | (KR) | 10-2022-0083210 |
| Nov. 8, 2022 | (WO) | PCT/KR2022/017387 |
| Nov. 8, 2022 | (WO) | PCT/KR2022/017389 |
| Mar. 23, 2023 | (WO) | PCT/KR2023/003891 |

(51) Int. Cl.
| *H05K 5/02* | (2006.01) |
| *B60K 35/00* | (2006.01) |
| *B60K 35/22* | (2024.01) |
| *B60K 35/53* | (2024.01) |

(52) U.S. Cl.
CPC .......... *H05K 5/0217* (2013.01); *B60K 35/00* (2013.01); *B60K 35/22* (2024.01); *B60K 35/223* (2024.01); *B60K 35/53* (2024.01)

(58) Field of Classification Search
CPC ...... H05K 5/0217; B60K 35/00; B60K 35/22; B60K 35/223; B60K 35/53; B60K 35/10
See application file for complete search history.

(56) References Cited

U.S. PATENT DOCUMENTS

| 2021/0284021 A1 | 9/2021 | Cheng |
| 2023/0034485 A1* | 2/2023 | Park ......................... G06F 3/14 |

FOREIGN PATENT DOCUMENTS

| DE | 10 2014 016 328 B3 | 3/2016 |
| DE | 10 2015 011 614 B4 | 4/2019 |
| DE | 10 2019 203 264 B3 | 4/2020 |
| DE | 10 2018 219 721 A1 | 5/2020 |
| DE | 10 2014 016 323 B4 | 11/2021 |
| JP | 2007-126135 A | 5/2007 |
| JP | 2017-181819 A | 10/2017 |

(Continued)

*Primary Examiner* — Yuen Wong
(74) *Attorney, Agent, or Firm* — Birch, Stewart, Kolasch & Birch, LLP

(57) ABSTRACT

The present disclosure introduces a display device for a vehicle, comprising: a fixing unit, a moving unit movably coupled to the fixing unit and configured to switch a state of the display device from a first state to a second state; and a display assembly coupled to the moving unit, configured to move together with the moving unit, and including a variable portion. The variable portion becomes flat in the first state and bent in the second state. The display assembly includes: a flexible display panel; a living hinge located on a rear surface of the flexible display panel and capable of being deformed corresponding to the bending of the variable portion; and a sheet coupled to a rear surface of the living hinge and configured to limit a maximum bending curvature of the variable portion while covering the grooves. The sheet is unfolded in the first state and is formed with wrinkles in the second state.

20 Claims, 20 Drawing Sheets

(56) References Cited

FOREIGN PATENT DOCUMENTS

| KR | 10-0251127 B1 | 4/2000 |
|---|---|---|
| KR | 10-2015-0092989 A | 8/2015 |
| KR | 10-2015-0136810 A | 12/2015 |
| KR | 10-2016-0097034 A | 8/2016 |
| KR | 10-2016-0114028 A | 10/2016 |
| KR | 10-2017-0022458 A | 3/2017 |
| KR | 10-2017-0033626 A | 3/2017 |
| KR | 10-2018-0024713 A | 3/2018 |
| KR | 10-1846737 B1 | 5/2018 |
| KR | 10-2021-0101022 A | 8/2021 |
| KR | 10-2021-0102836 A | 8/2021 |
| WO | WO 2020/257380 A1 | 12/2020 |
| WO | WO 2022/063866 A1 | 3/2022 |

\* cited by examiner (a)

(b)

(a)

(b)

DEFORMABLE DISPLAY DEVICE FOR VEHICLE

CROSS REFERENCE TO RELATED APPLICATIONS

Pursuant to 35 U.S.C. § 119 (a), this application claims priority to Korean Patent Application No. 10-2022-0083210, filed on Jul. 6, 2022, in the Republic of Korea, and International Patent Application Nos. PCT/KR2022/017389, filed on Nov. 8, 2022, PCT/KR2022/017387, filed on Nov. 8, 2022, and PCT/KR2023/003891, filed on Mar. 23, 2023, the entire contents of all these applications are incorporated by reference into the present application.

TECHNICAL FIELD

The present disclosure relates to a deformable display device for a vehicle, and more particularly, to a display device which can change its shape when needed. Further particularly, the deformable display device can change its position as well as shape.

BACKGROUND

A vehicle includes various input means and output means as a device for a user interface. Conventionally, as the input means, mechanical input means such as a button, a dial, and a lever were mainly used, but recently, the number of vehicles to which a method for a user to more intuitively input a command, such as voice input means, touch input means, and even gesture input means, is applied is increasing.

A cluster including a dashboard providing information on a speed, an RPM, an amount of fuel, and the like of the vehicle was the most basic output means, but as a display technology has improved and functions of the vehicle have become more precise and diversified, vehicles that include a display assembly are increasing so as to output various contents.

In the past, a small liquid crystal display for outputting sound was all, but recently, a navigation device and a large display assembly for showing a state of the vehicle are being applied to a center fascia between a driver's seat and a front passenger's seat. Furthermore, the dashboard of the cluster may also not be in a needle type and may be applied with a display, thereby providing various information.

In addition, a head up display (HUD) output on a front windshield has become common such that the user may see important information without turning eyes thereof, so that a driver may check the speed or navigation guidance while looking forward.

The display not only simply outputs the information, but also has a touch sensor such that a touch input is able to be made at the same time, so that the display may function as the output means and the input means at the same time. Therefore, a size of the display applied to the vehicle is gradually increasing.

However, because an instrument panel including the dashboard and the center fascia is located at a front portion of the vehicle, when a size of the panel increases, a view in a forward direction is obstructed. In addition, as an autonomous driving function has recently become more advanced, there is a situation in which the function of the instrument panel of providing the information to the user is unnecessary or reduced during the autonomous driving, so that a large instrument panel is not always good.

SUMMARY

The present disclosure is to provide a display device for a vehicle which is capable of changing its shape to reduce a space occupied.

The present disclosure is to provide a display device for a vehicle which is capable of changing its position not to obstruct a driver's view in a forward direction.

The present disclosure is to provide a display device for a vehicle which is capable of, when the display device is applied to a vehicle, changing it shape depending on a status of the vehicle.

The present disclosure is to provide a display device for a vehicle capable of being extended when needed and at least partially accommodated or hidden when not needed selectively to change a size of a screen to be exposed.

The present disclosure is to provide a display device for a vehicle which is capable of being selectively bent or flat so as to adjust driver's angles of view to the display device.

The present disclosure is to provide a display device for a vehicle which is capable of having different curvature at different portions of the display device.

In addition, the present disclosure is to provide a display device equipped with a moving unit capable of simultaneously performing a linear motion and a curved motion with power of one motor.

In addition, the present disclosure is to improve rigidity of a display assembly via a rear support structure and a sheet that prevents bending deformation in a reverse direction such that there is no damage in a flexible structure.

To achieve the above-identified objects, there is provided a display device which includes a fixing unit, a moving unit movably coupled to the fixing unit and configured to switch a state of the display device from a first state to a second state, and a display assembly coupled to the moving unit, configured to move together with the moving unit, and including a variable portion. The variable portion becomes flat in the first state and bent in the second state. The display assembly includes a flexible display panel, a living hinge located on a rear surface of the flexible display panel and capable of being deformed corresponding to the bending of the variable portion, and a sheet coupled to a rear surface of the living hinge and configured to limit a maximum bending curvature of the variable portion while covering the grooves. The sheet is formed with wrinkles in the first state and is unfolded in the second state.

The living hinge may include a plurality of grooves extending in a horizontal direction in the rear surface thereof and arranged side by side in a vertical direction, and the wrinkles of the sheet may be formed at positions corresponding to the grooves.

The display device may further include a plurality of rigid ribs located between the plurality of grooves and extending in the horizontal direction.

The plurality of rigid ribs may be arranged so as to be spaced apart from each other while defining a predetermined gap therebetween in the horizontal direction. Ends of rigid ribs adjacent to each other in the vertical direction may be misaligned with each other.

The living hinge may contain an elastic material, and the groove may have a V-shaped cross-section.

The fixing unit may include a vertical base extending in a vertical direction, and a side rail formed at a front portion of a side surface of the vertical base and having a lower end extending while protruding forward. The display device may include a hinge wing portion protruding from the rear surface of the living hinge and moving along the side rail.

The hinge wing portion may include a plurality of hinge wing portions arranged in the vertical direction.

The vertical base may include a pair of vertical bases arranged in a horizontal direction, the side rail may include a pair of side rails formed on opposite sides of the pair of vertical bases, respectively, and the hinge wing portion may include a pair of hinge wing portions disposed in a bilaterally symmetrical manner and coupled to the pair of side rails for guiding variable portion.

The display assembly may include an upper portion located on an upper side of the variable portion and having no change in a curvature, and a lower portion located on a lower side of the variable portion and having no change in a curvature. The display device may include a first back plate coupled to a rear surface of the upper portion, and a second back plate coupled to a rear surface of the lower portion.

The first back plate may include a first extension fixed to the upper portion and covering at least a portion of the living hinge. The second back plate may include a second extension fixed to the lower portion and covering at least a portion of the living hinge. The first extension and the second extension may not overlap each other.

The moving unit may include a curved-moving unit protruding forward and downward while drawing a curved line with respect to the fixing unit when the state is switched from the first state to the second state. The curved-moving unit may be coupled to the second back plate. The moving unit may further include a straight-moving unit vertically moving with respect to the fixing unit. The straight-moving unit may be coupled to the first back plate. In the second state, the display assembly may become bent with a lower portion thereof protruding forward.

The display device may further include a driving unit for providing power to the curved-moving unit. The curved-moving unit may include a lower arm including a curved rack gear engaged with a pinion gear of the driving unit. An upper arm coupled to an upper end portion of the lower arm and providing power to the straight-moving unit.

The living hinge may include a plurality of grooves on a rear surface thereof. The sheet may be attached only to the rigid ribs between the grooves.

To achieve the above-identified objects, there is further provided a display device including a fixing unit, a moving unit movably coupled to the fixing unit and configured to switch a state of the display device from a first state to a second state, and a display assembly coupled to the moving unit, configured to move together with the moving unit, and including a variable portion. The variable portion becomes flat in the first state and bent in the second state. The fixing unit includes a vertical base extending in a vertical direction, and a side rail formed at a front portion of a side surface of the vertical base and having a lower end extending while protruding forward. The display assembly includes a flexible display panel, a living hinge located on a rear surface of the flexible display panel and capable of being deformed corresponding to the bending of the variable portion, and a hinge wing portion protruding from a rear surface of the living hinge and moving along the side rail.

The hinge wing portion may include a plurality of hinge wing portions arranged in the vertical direction.

The vertical base may include a pair of vertical bases arranged in a horizontal direction, the side rail may include a pair of side rails formed on opposite sides of the pair of vertical bases, respectively. The hinge wing portion may include a pair of hinge wing portions disposed in a bilaterally symmetrical manner and coupled to the pair of side rails for guiding variable portion.

The display assembly may include an upper portion located on an upper portion of the variable portion and having no change in a curvature during the transition from the first state to the second state, and a lower portion located on an lower portion of the variable portion and having no change in a curvature during the transition from the first state to the second state. The display device may include a first back plate coupled to a rear surface of the upper portion, and a second back plate coupled to a rear surface of the lower portion.

The display device defined in the appended claims provides the advantage of, when the display device is applied to the vehicle, adjusting a space occupied in a vehicle by deforming its shape to be flat or bent selectively.

The display device defined in the claims provides the advantage of, when the display device is applied to the vehicle, not obstructing the driver's view in a forward direction.

The display device defined in the claims also provides the advantage of, when the display device is applied to the vehicle, facilitating the driver of the vehicle to notice particular information in a screen of the display device easily and quickly by changing a curvature of the display device and thus providing an optimal view angle to that particular information.

The display device defined in the claims also provides the advantage of, when the display device is applied to the vehicle, facilitating the driver to notice information necessary for a current state of a vehicle by changing the shape of the display device in response to an input signal indicating the state of the vehicle.

Since the display device can change its shape according to the input signal indicating a state of the vehicle, users can notice a current state of the vehicle in a simple and intuitive way from the shape of the display device.

The display device defined in the claims also can be effectively protected from unintended external force and thus possible damages on the display device can be avoided by changing the shape of the display device depending on scenes in which the display device is used.

The display device defined in the claims can be extended or protruded when needed and at least partially accommodated or hidden when not needed to adjust the size of the screen to be exposed.

In addition, the display device may have the changeable shape, thereby being retracted and extended even when the accommodation space and the extension direction do not match each other.

Since the moving unit transmits the power of the motor via a linkage mechanism, the curved motion of a lower portion of the display assembly and the linear motion of an upper portion of the display assembly may be performed simultaneously.

Since the display assembly has the rigidity even in the bent state, the touch input on the bent display assembly is possible. Further since the deformation or bending in the reverse direction is prevented, the durability of the display assembly may be enhanced.

DETAILED DESCRIPTION

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be directly connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
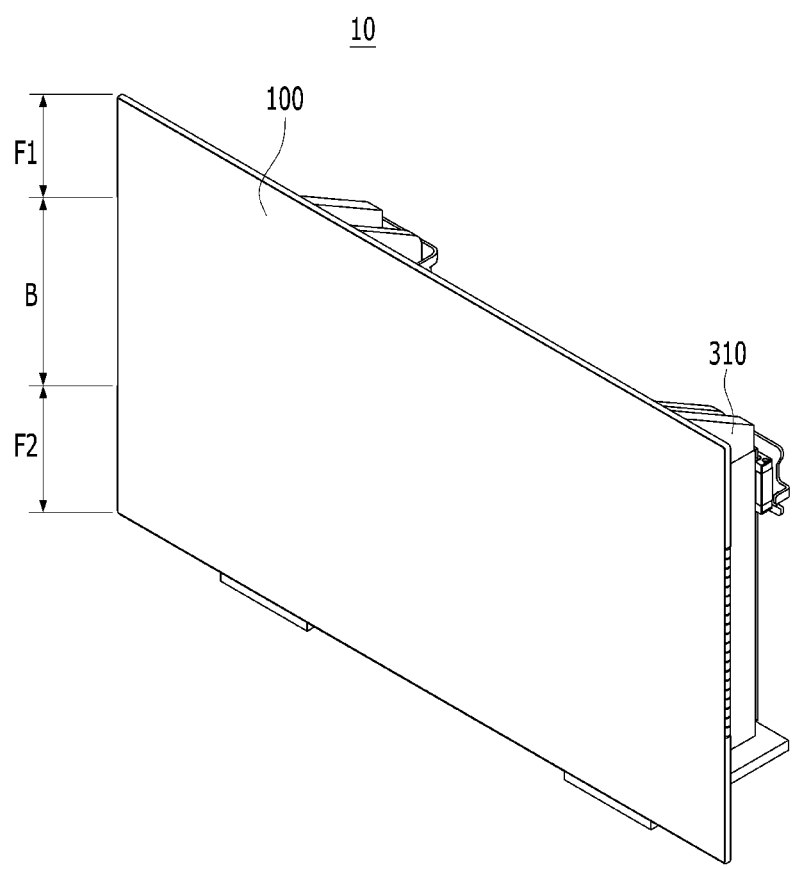
FIG. 1 is a front perspective view showing a first state of a display device according to the embodiment of the present disclosure.
Figure 2:
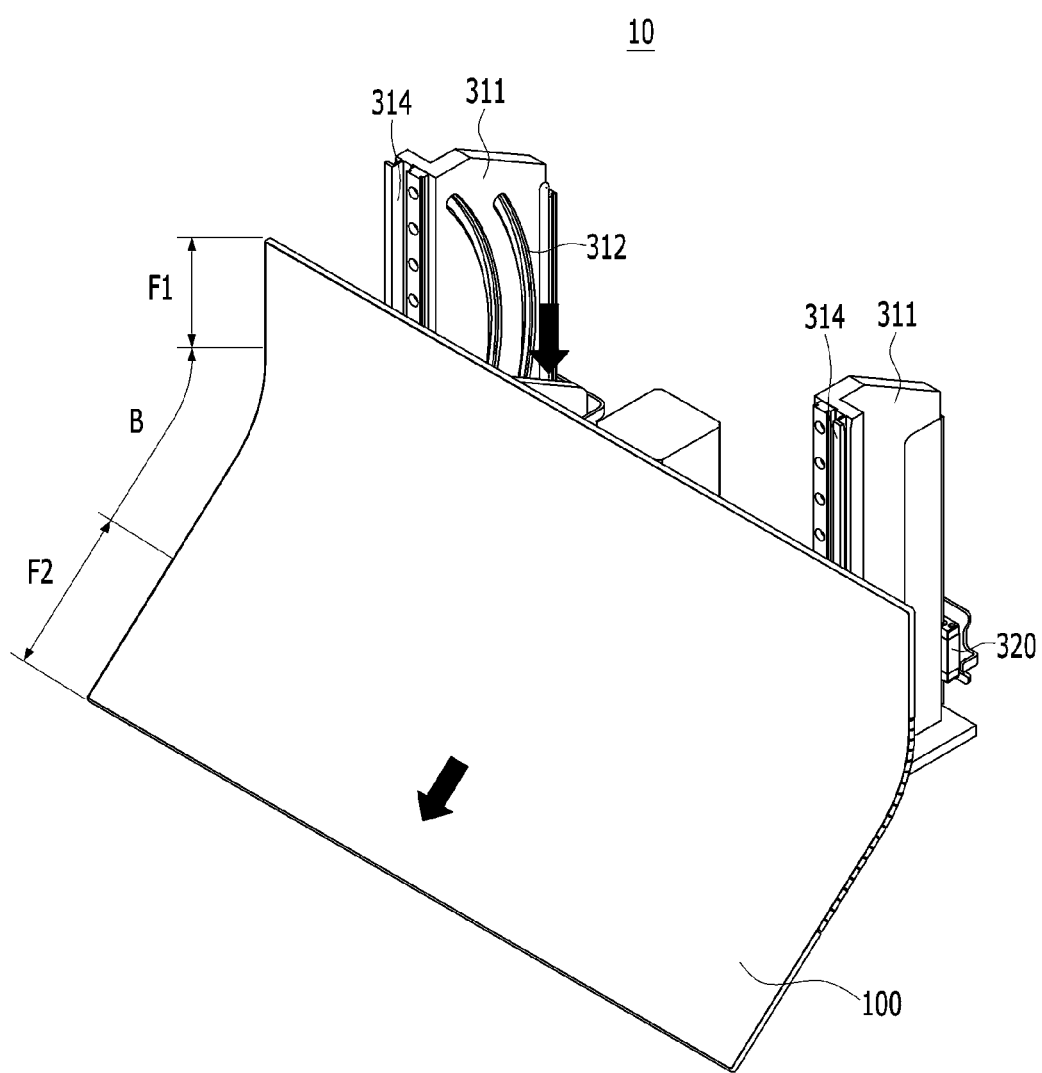
FIG. 2 is a front perspective view showing a second state of a display device according to an embodiment of the present disclosure.

FIG. 1 is a front perspective view showing a first state of a display device 10 according to an embodiment of the present disclosure, and FIG. 2 is a front perspective view showing a second state of the display device 10 according to the embodiment of the present disclosure.

The display device 10 may be used when a large screen is to be implemented in a limited space. The display device 10 may be installed in a place where a limited space has to be efficiently utilized by changing a shape and/or position of the display device 10 as needed. For example, the display device 10 may be used as an instrument panel located at a front portion of a vehicle.

The display device 10 can switch between a first state in FIG. 1 and a second state in FIG. 2. When switching from the first state to the second state, a display assembly 100 may become bent as shown in FIG. 2 at the same time while moving downwards. The directional term "downward(s)" refers to a direction starting from the upper end of the display assembly 100 to the lower end of the display assembly 100 when the display assembly is flat.

The display assembly 100 may include a display panel on a front surface thereof and a rear structure for covering the display assembly 100 on a rear surface thereof. The display device 10 may include a fixing unit 310 that fixes the display device 10 to the vehicle or a specific place. The display device 10 may further include a moving unit configured to change a shape and position of the display assembly 100. The moving unit is attached to the rear structure of the display assembly 100. The display device 10 may further include a driving unit 330 for generating power transferred to the moving unit.

The display panel may display graphic objects corresponding to various information. The display panel may include at least one of a liquid crystal display (LCD), a thin film transistor-liquid crystal display (TFT LCD), an organic light-emitting diode (OLED), a flexible display, a three-dimensional display (3D display), and an e-ink display. The display panel may have a layered structure with or integrally formed with touch input means to implement a touch screen.

For the bending deformation as shown in FIG. 2, the flexible display such as an organic light-emitting diode (OLED) may be used. Even when a flexible display panel is used, it is difficult to maintain rigidity when all sections of the display panel are bent, so that, as shown in FIG. 2, a partial section may be a variable portion B where the bending deformation occurs. Upper and lower portions F1 and F2 may be coupled respectively to upper and lower sides of the variable portion B.

If an entirety of the display assembly 100 would be bent, it would be difficult for the display assembly 100 to be coupled with the moving unit for the deformation and the position change of the display assembly 100. In addition, due to a flexible structure, a degree of freedom in the shape change increases, so that there is a risk of deformation into an unintended shape.

In contrast with the variable portion B, the upper portion F1 moves only in a vertical direction, and the lower portion F2 moves downward and at the same time protrudes obliquely forward. The directional term "forward" refers to a direction in which the screen on the display assembly 100 in the 'flat' state heads. The moving directions of the upper portion F1 and the lower portion F2 are different from each other, and as a result, a curvature of the variable portion B positioned between the upper portion F1 and the lower portion F2 changes.

Figure 3:
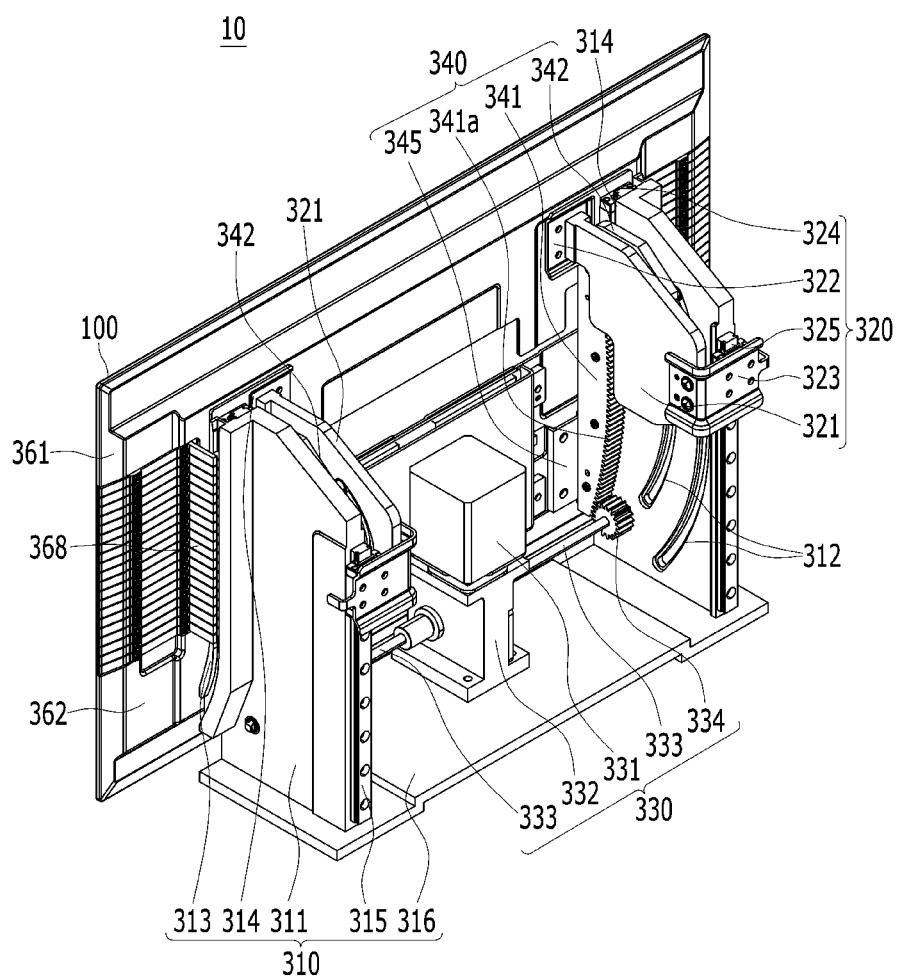
FIG. 3 is a rear perspective view showing a first state of a display device according to an embodiment of the present disclosure.
Figure 4:
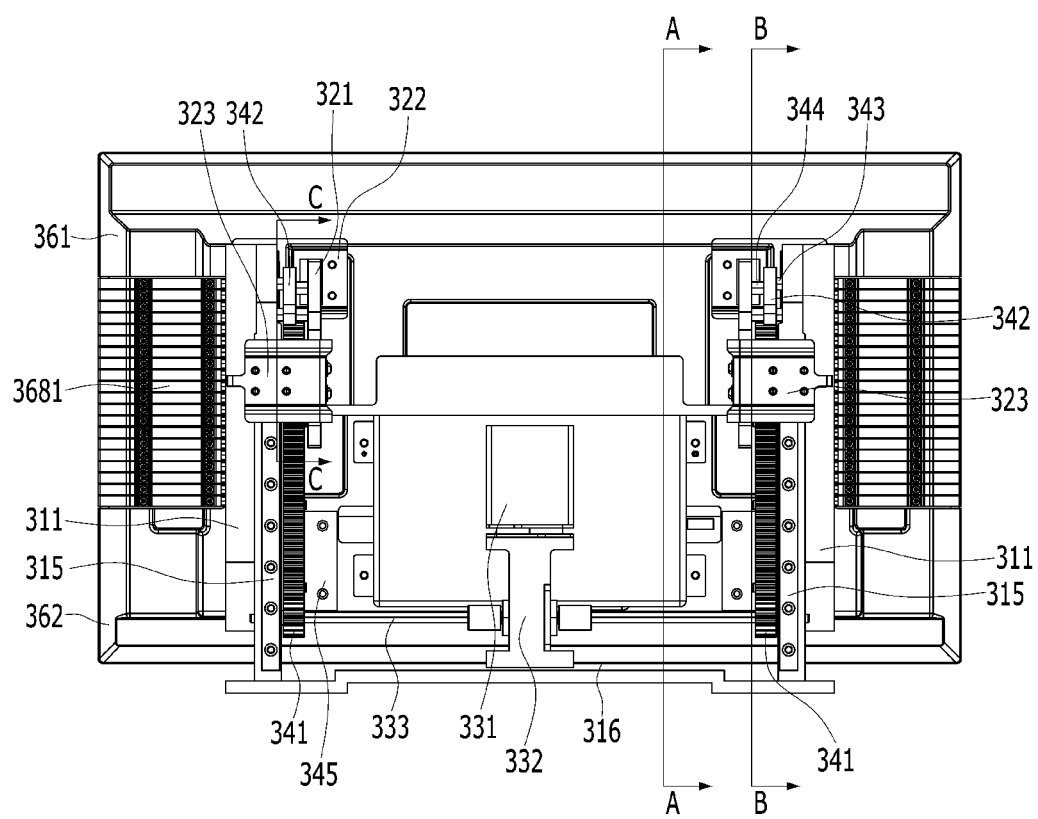
FIG. 4 is a rear view showing a first state of a display device according to an embodiment of the present disclosure.

FIG. 3 is a rear perspective view showing a first state of the display device 10 according to an embodiment of the present disclosure, and FIG. 4 is a rear view showing a first state of the display device 10.

A structure for mounting the display assembly 100 while changing the position and the shape of the same is located on the rear surface of the display assembly 100 of the display device 10.

The structure may include the fixing unit 310, the moving unit, and the driving unit 330. The fixing unit 310 is a part that fixes the display device 10 to another object like a vehicle. The driving unit 330 is located on the fixing unit 310 and provides power for moving the moving unit relative to the fixing unit 310.

The moving unit moves by receiving the power of the driving unit 330. The moving unit is coupled to one of the portions F1 and F2 of the display assembly 100 to induce the movement and the deformation of the display assembly 100. Preferably, the moving unit may be coupled to both of the portions F1 and F2 of the display assembly 100. The moving unit may comprise the curved-moving unit 340 coupled to the lower portion F2. Preferably, the moving unit may further comprise a straight-moving unit 320 coupled to the upper portion F1. However, without the straight-moving unit 320, the change of the shape and/or position of the display device 10 can be performed by the curved-moving unit 340 only.

The curved-moving unit 340 may include a lower arm 341, an upper arm 342, guide protrusions 343, 344, and a second front bracket 345. The straight-moving unit 320 may include a moving plate 321, a first front bracket 322, a rear bracket 323, a first guide block 324, and a second guide block 325.

The fixing unit 310 may include a horizontal base 316 and a vertical base 311 extending vertically from the horizontal base 316. The vertical base 311 may be formed with rails 312, 314, and 315 for the moving units 320 and 340 to slide. The moving units 320 and 340 may move relative to the vertical base 311 and change the position of the display assembly 100.

As shown in FIG. 3, a pair of vertical bases 311 may be disposed on left and right sides, and accordingly, a pair of straight-moving units 320 and a pair of curved-moving units 340 may be disposed on the left and right sides. Due to the pair of straight-moving units 320 and the pair of curved-moving units 340 disposed on the left and right sides of the display device 10, the display assembly 100 may move stably without shaking.

The straight-moving unit 320 may move the upper portion F1 of the display assembly 100 in the vertical direction. The curved-moving unit 340 may guide the lower portion F2 of the display assembly 100 to protrude forward when moving in the downward direction.

The straight-moving unit 320 may move in the vertical direction along a straight rail formed on the vertical base 311. The curved-moving unit 340 may move along a curved rail.

The vertical base 311 may include the straight rail extending in the vertical direction. The vertical base 311 may include the first straight rail 314 positioned at a front surface of the vertical base 311 as shown in FIG. 2. The vertical base 311 may further include a second straight rail 315 positioned at a rear surface as shown in FIG. 3. The straight rail may be disposed on only one side of the vertical base 311, but preferably a pair of straight rails may be disposed on front and rear sides of the vertical base 311 to move the display assembly 100 without twisting while supporting a weight of the display assembly 100.

The straight-moving unit 320 may include the first guide block 324 that moves along the first straight rail 314 formed on the vertical base 311. The straight-moving unit 320 may further include the second guide block 325 that moves along the second straight rail 315.

The first guide block 324 may be fastened to the first front bracket 322. The second guide block 325 may be fastened to the rear bracket 323. The moving plate 321 may be connected to the first front bracket 322. The moving plate 321 may be positioned between the first front bracket 322 and the rear bracket 323. The moving plate 321 may be disposed such that the first guide block 324 and the second guide block 325 move simultaneously.

As shown in FIG. 3, the moving plates 321 may be located at an inner side where the pair of vertical bases 311 face each other. The moving plate 321 may be disposed at a predetermined spacing from the vertical base 311.

Figure 5:
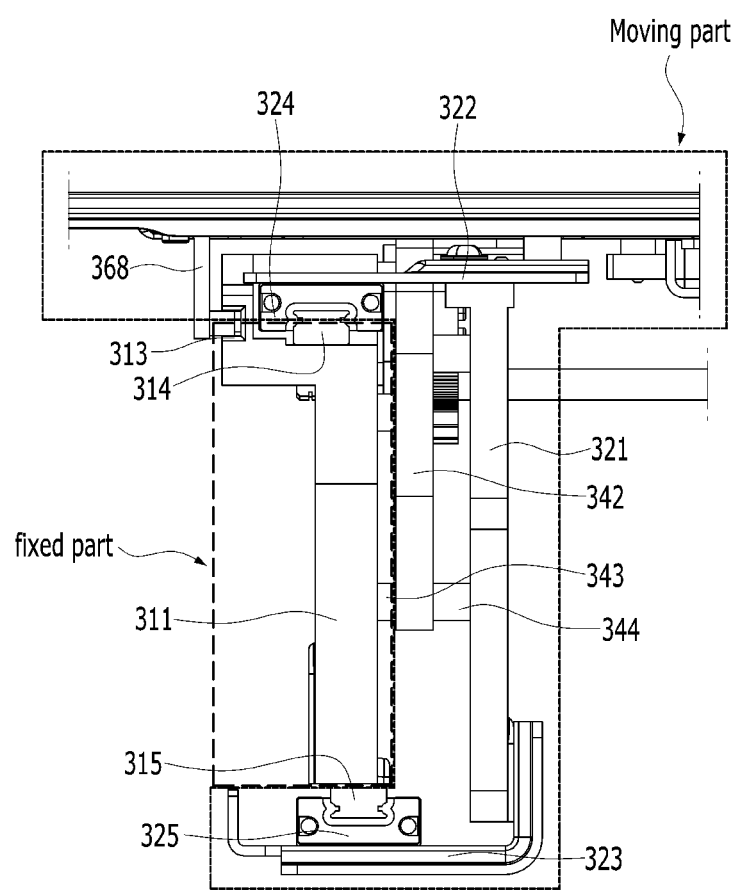
FIG. 5 is a top view of a moving unit of a display device according to an embodiment of the present disclosure.

FIG. 5 is a plan view showing a moving unit of the display device 10 according to the embodiment illustrated in the drawings. The moving plate 321 may not be directly coupled to the straight rails 314 and 315, but may be coupled to the straight rails 314 and 315 using the first front bracket 322 and the rear bracket 323. A space may be provided between the moving plate 321 and the vertical base 311.

As shown in FIG. 5, the curved-moving unit 340 may be positioned between the vertical base 311 and the moving plate 321. The curved-moving unit 340 may include the lower arm 341 having a lower portion coupled to a rear surface of the lower portion F2 and extending upwards. The lower portion of the lower arm 341 may be coupled to the lower portion F2 via the second front bracket 345 (see FIG. 3).

The curved-moving unit 340 may further include the upper arm 342 connected to the lower arm 341. The upper arm 342 may include guide protrusions 343 and 344 moving along curved rails 312 and 326.

The lower arm 341 may receive the power of the driving unit 330 and push the lower portion F2 forward. The guide protrusions 343 and 344 of the upper arm 342 may form a moving path of the curved-moving unit 340 while moving along the curved rails 312 and 326. The lower arm 341 may include a curved rack gear 341a located on a rear surface thereof to receive the power from the driving unit 330.

A fixed part in FIG. 5 may correspond to the fixing unit 310, and moving parts in the same figure may include the moving units 320 and 340 and the display assembly 100 moving together with the moving units 320 and 340.

The driving unit 330 provides the power to the moving units 320 and 340. The driving unit 330 may include a motor 331 and a pinion gear 334 that transmits the power of the motor 331. The motor 331 may be fixed on the fixing unit 310, preferably on the horizontal base 316. As shown in FIG. 3, horizontal shafts 333 may be included to transmit the power of one motor 331 to the left and right to transmit the power to the pair of moving units 320 and the pair of moving units 340 disposed in a bilaterally symmetrical manner.

In a case of having two motors 331, the cost for the display device increases, so that it is preferable to use one single motor 331 to synchronize driving of the pair of moving units 320 and the pair of moving units 340. As shown in FIG. 4, the motor 331 is located between the pair of vertical bases 311, the horizontal shaft 333 extends in a left and right direction, and each pinion gear 334 is coupled to an end of each horizontal shaft 333.

In order to distribute the power of the motor 331 to the pair of horizontal shafts 333 and to change a rotation direction of the motor 331, a plurality of gears may be used. A gear box 332 in which the gears are located may be located beneath the motor 331.

The pinion gear 334 may be engaged with the curved rack gear 341a formed on the lower arm 341 of the curved-moving unit 340, and the curved rack gear 341a may move while drawing a curved line when the pinion gear 334 rotates. The rear surface of the lower arm 341 on which the curved rack gear 341a is formed convexly protrudes rearwards, so that when the pinion gear 334 rotates, the curved rack gear 341a may move while drawing a curved trajectory rather than a straight line.

Figure 6:
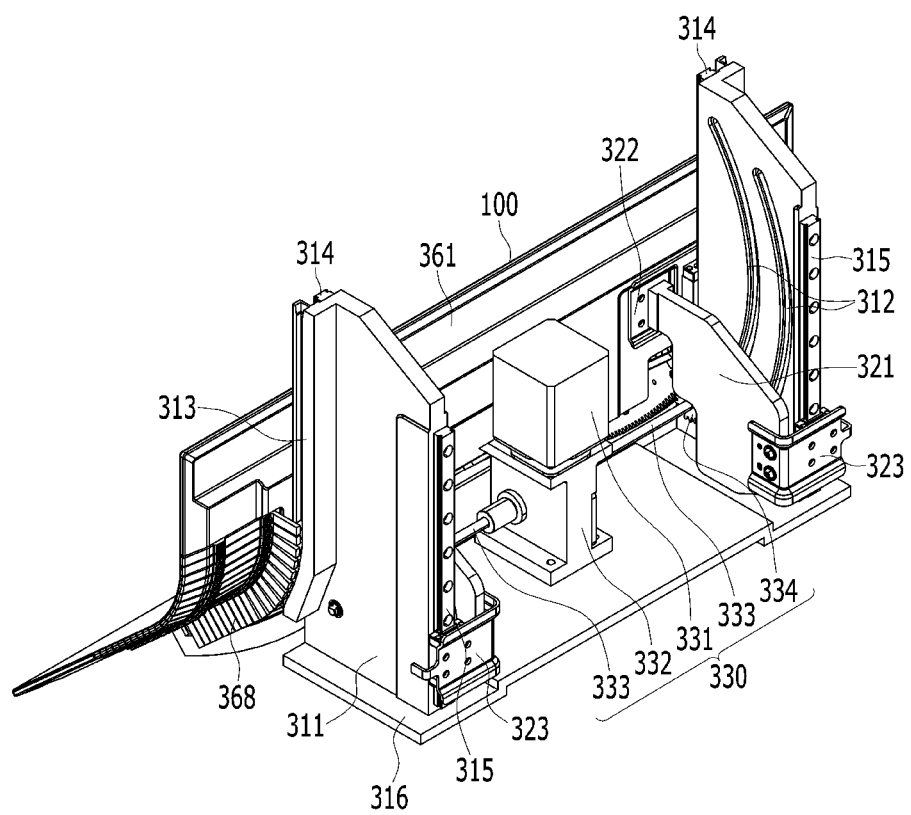
FIG. 6 is a rear perspective view showing a second state of a display device according to an embodiment of the present disclosure.
Figure 7:
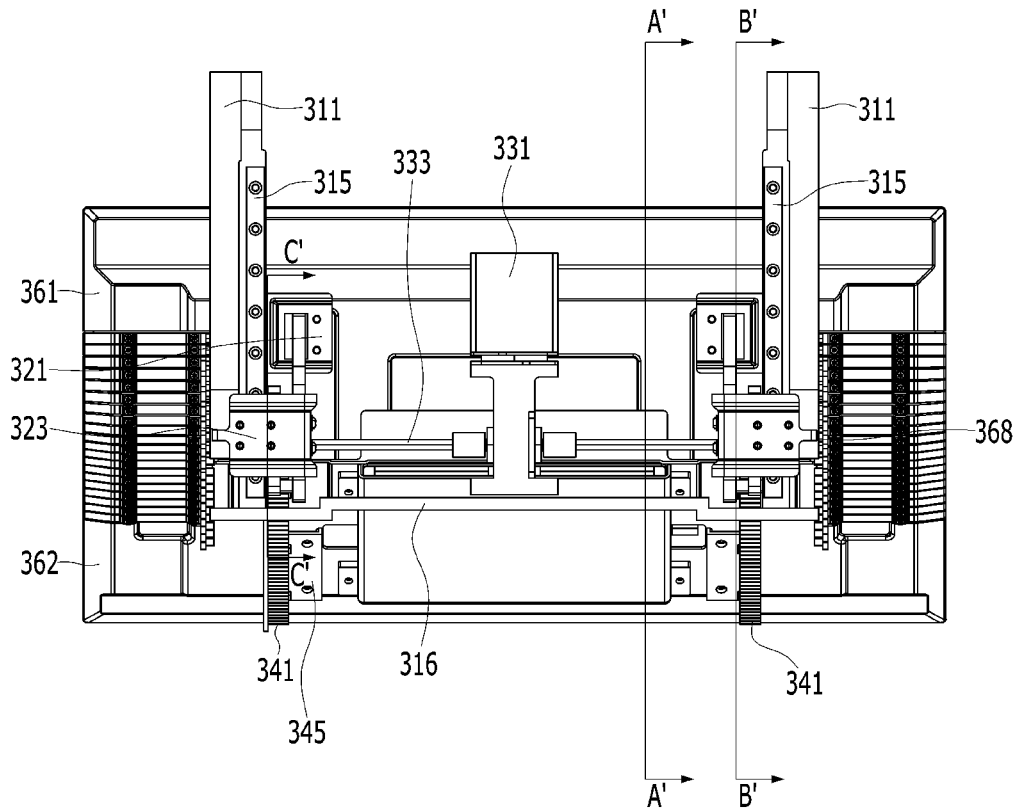
FIG. 7 is a perspective view showing a moving unit of a display device according to an embodiment of the present disclosure.

FIG. 6 is a rear perspective view showing a second state of the display device 10, and FIG. 7 is a rear view showing a second state of the display device 10.

When the driving unit 330 operates and is switched from the first state to the second state, the curved-moving unit 340 pushes a lower end of the display assembly 100 forward, and the upper portion F1 of the display assembly 100 coupled to the straight-moving unit 320 moves in the vertical direction separately from the lower portion F2 and maintains a direction thereof of facing forward.

The lower portion F2 of the display assembly 100 may move downwardly below the horizontal base 316 as shown in FIG. 7 and protrude forward as shown in FIG. 6. The variable portion B may be bent while drawing a curved line, and the rear structure of the display assembly positioned on a rear surface of the variable portion B may include a living hinge 365 to enable the bending deformation in the vertical direction.

The living hinge 365 may be formed by attaching bar-shaped members elongated in a horizontal direction to each other in the vertical direction, or may be implemented by defining a groove 3652 extending in the horizontal direction in a rear surface of an elastic member. The horizontal direction refers to the direction which is orthogonal to the direction "downward" and extends from one side end of the display assembly 100 to the other side end of the display assembly 100.

The upper portion F1 and the lower portion F2 are guided by being coupled to the moving units 320 and 340, but the shape of the variable portion B changes, so that it is difficult to have brackets on the variable portion B which are also connected to the moving units 320 and 340. The variable portion B is not coupled directly to the moving units 320 and 340, but is fastened to a side rail 313 that guides a moving path as shown in FIG. 6, thereby moving along a predetermined curved trajectory along the curved rails 312 and 326.

Figure 8:
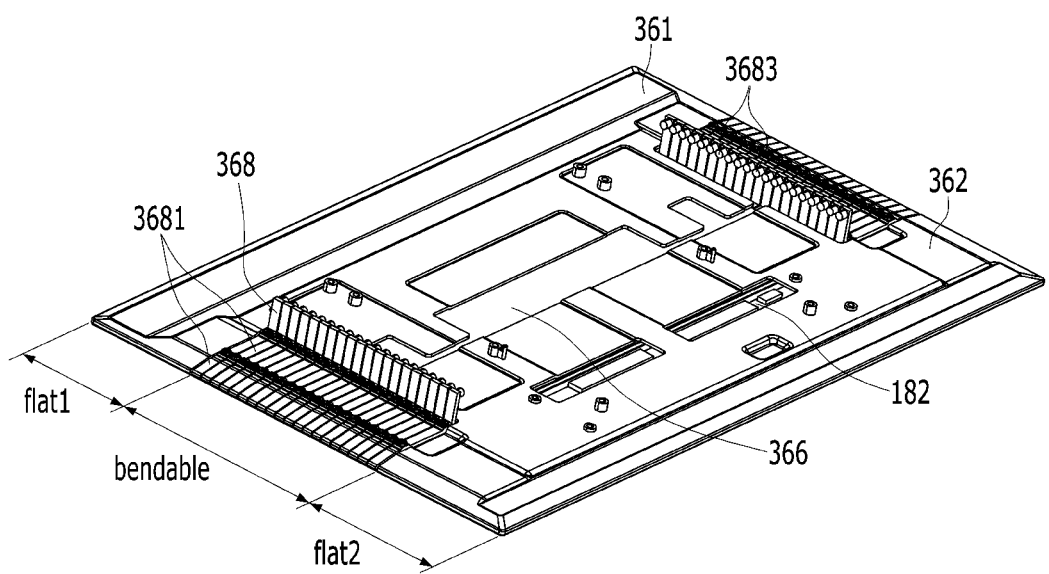
FIG. 8 is a diagram showing a rear surface structure of a display assembly of a display device according to an embodiment of the present disclosure.

FIG. 8 is a diagram showing a structure of a rear surface of the display assembly 100 of the display device 10. As described above, the display assembly 100 may comprise the upper portion F1, the variable portion B, and the lower portion F2. Rigid back plates 361 and 362 may be coupled to the upper portion F1 and the lower portion F2.

The back plate is divided into the first back plate 361 coupled to the upper portion F1 and the second back plate 362 coupled to the lower portion F2. The solid back plate may be omitted at the variable portion B. The living hinge 365 may be disposed at a portion corresponding to a rear side of the variable portion B to enable the bending deformation of the variable portion B.

The back plates 361 and 362 may include extensions 361a and 362a extending toward the variable portion B, respectively. The extensions 361a and 362a are not coupled to the display assembly 100, so that the extensions 361a and 362a may be spaced apart from the rear surface of the display assembly 100 in the second state in which the variable portion B is bent (see FIG. 15).

An end of the extension portion 361a of the first back plate 361 and an end of the extension portion 362a of the second back plate 362 may meet each other at a center of the variable portion so as not to overlap each other.

When the motor 331 is driven in the first state, and when the curved-moving unit 340 moves downward and forward, an upper end of the extension 362a of the second back plate 362 located below is spaced apart from the rear surface of the display assembly 100 first, and then, a lower end of the extension 361a of the first back plate 361 is spaced apart from the rear surface of the display assembly 100.

Figure 15:
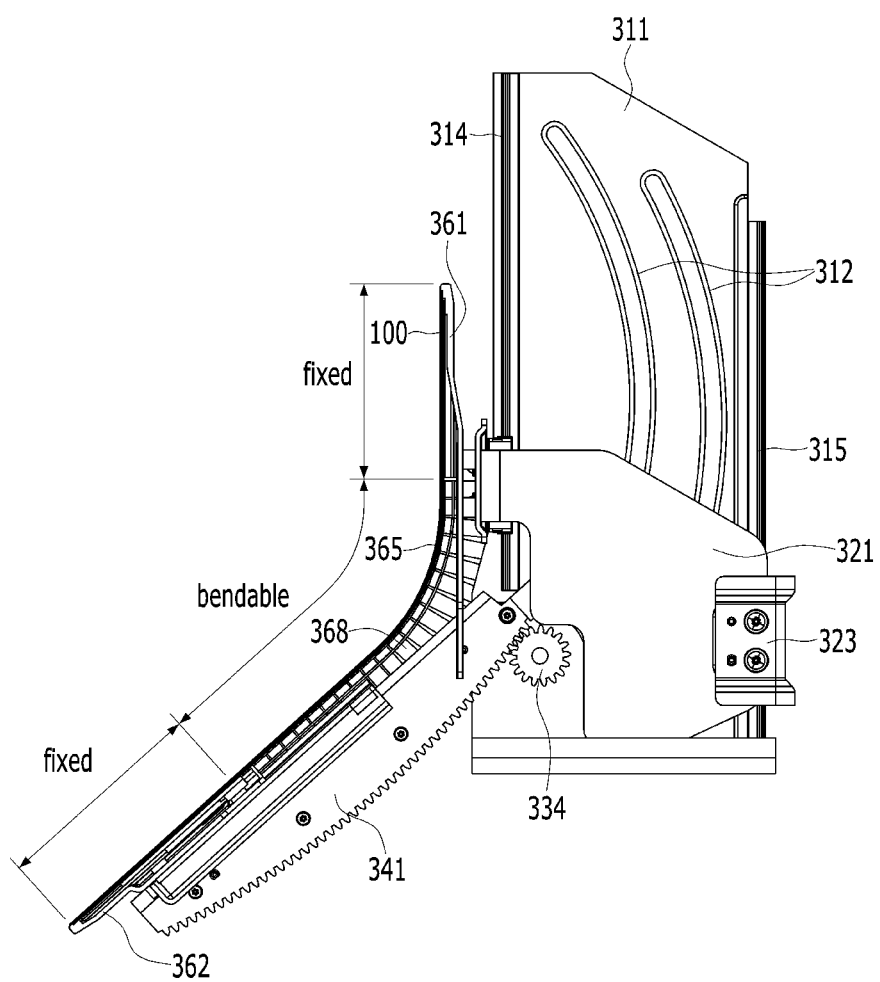
FIG. 15 is a cross-sectional view taken along a line A'-A' in FIG. 7.

As the display assembly 100 moves downward, a curved surface of a lower portion of the variable portion B becomes a flat surface again, so that a spacing between the second back plate 362 and a display panel 151 may be reduced as shown in FIG. 15.

The living hinge 365 may be covered by the extensions 361a and 362a, and as shown in FIG. 8, a hinge wing portion 368 for guiding a moving path of the variable portion B may protrude from a rear surface of the living hinge 365.

The hinge wing portion 368 may be made of a metal material for rigidity and may include a wing fixing portion 3681 for covering the rear surface of the living hinge 365 so as to fix the hinge wing portion 368 to the living hinge 365.

Figure 9:
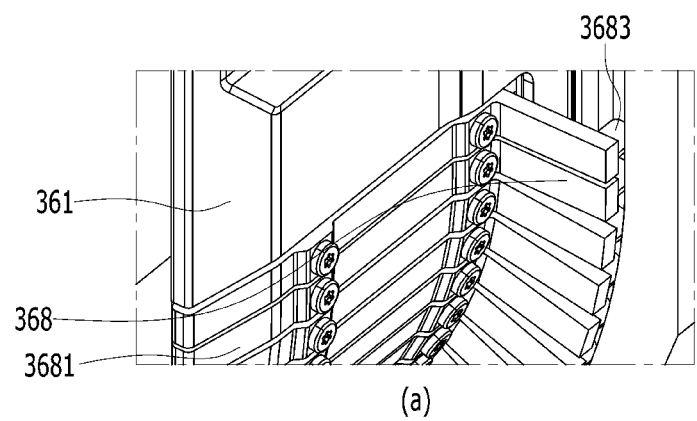
FIG. 9 is a diagram showing a side rail and a hinge wing portion of a display device according to an embodiment of the present disclosure.
Figure 9:
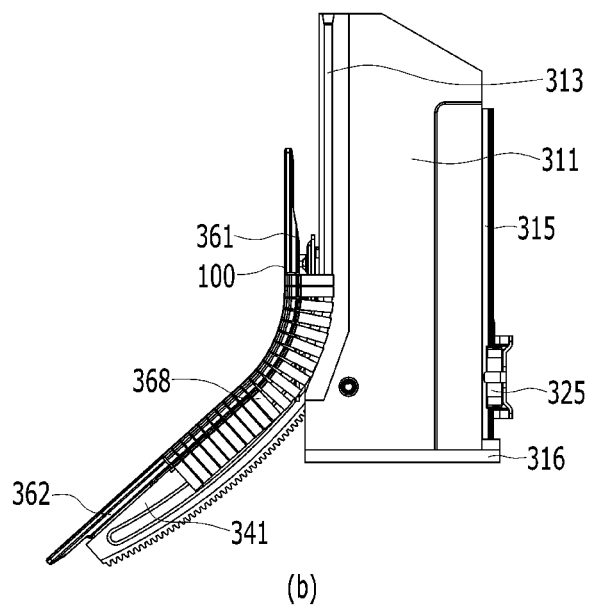

FIG. 9 is a diagram showing the side rail 313 and the hinge wing portion 368 of the display device 10. FIG. 9(a) is an enlarged view of a third guide protrusion 3683 inserted into the side rail 313, and FIG. 9(b) is a side view showing the second state.

As shown in FIG. 9(a), the hinge wing portion 368 may include the third guide protrusion 3683 inserted into the side rail 313 to move along the side rail 313 formed at a side of the vertical base 311.

As shown in FIG. 9(b), an upper portion of the side rail 313 may be straight in the vertical direction, but a lower portion thereof may be curved in the forward direction. The third guide protrusion 3683 of the hinge wing portion 368 may be located in the upper straight section of the side rail 313 in the first state, but when switched to the second state, may move to the curved section of the side rail 313, so that the lower portion F2 of the display may protrude as shown in FIG. 9(b).

As shown in FIG. 8, the hinge wing portion 368 may be disposed in a bilaterally symmetrical manner. In this regard, the third guide protrusion 3683 may be disposed to face each other.

Because the hinge wing portion 368 is made of the rigid material, the extensions 361a and 362a may be omitted in the portion where the wing fixing portion 3681 of the hinge wing portion 368 is located, and the extensions 361a and 362a may be located only between the hinge wing portions 368.

Figure 10:
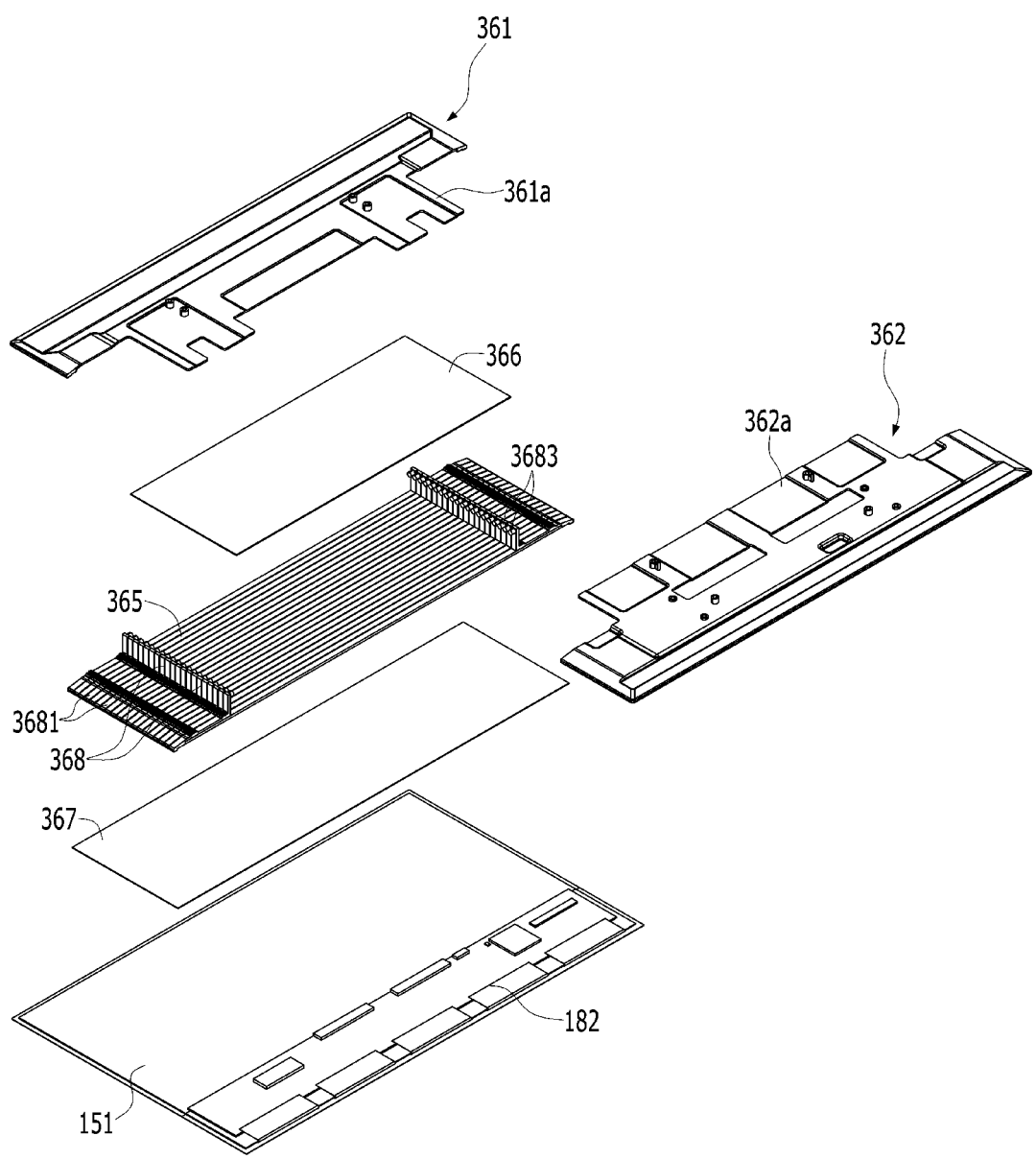
FIG. 10 is an exploded perspective view of a display assembly and a rear surface structure thereof of a display device according to an embodiment of the present disclosure.

FIG. 10 is an exploded perspective view of the display assembly 100 of the display device 10 and a structure of a rear surface thereof. The display assembly 100 may comprise the display panel 151, and the living hinge 365 and the back plates 361 and 362 located on the rear surface of the display panel 151. The living hinge 365 may include a front sheet 367 for attachment to the display panel 151 and a sheet 366 that limits the curvature of the variable portion B while covering the groove 3652 defined in the rear surface of the living hinge 365.

As described above, the hinge wing portions 368 exposed to the outside may be located at left and right sides of the rear surface of the living hinge 365, respectively. A portion thereof overlapping the extensions 361a and 362a of the back plates may be covered with the sheet 366.

A panel driving unit 182 for controlling driving of the display panel 151 may be located at a lower portion of the display panel 151. As shown in FIG. 8, the second back plate 362 may include an opening for partially exposing the panel driving unit 182 so as to connect the panel driving unit 182 and a main substrate to each other.

Figure 11:
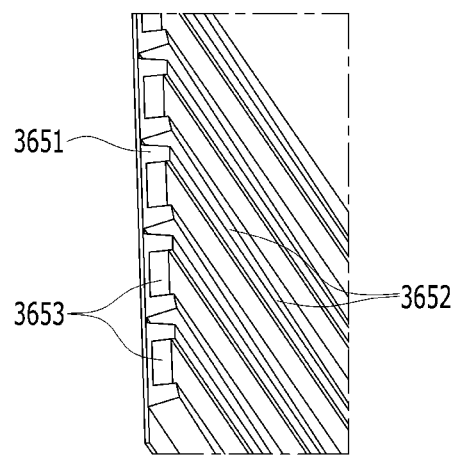
FIG. 11 is a diagram showing a living hinge of a display device according to an embodiment of the present disclosure.
Figure 11:
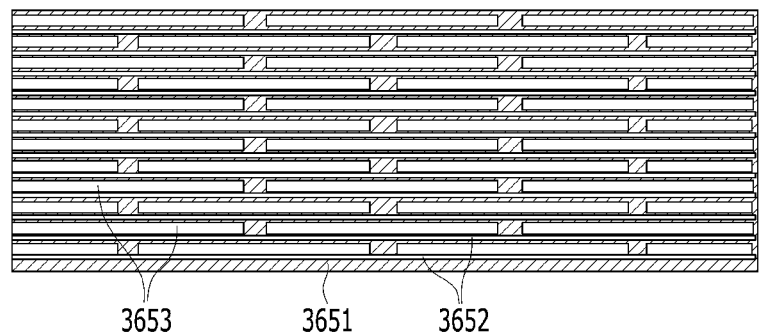

FIG. 11 is a diagram showing the living hinge 365 of the display device 10. The living hinge 365 may be bendable using an elastic material 3651. The living hinge 365 may have a predetermined thickness so as to have rigidity to support a rear surface of the flexible display panel 151.

However, if the living hinge 365 get thicker, the bending deformation would be difficult. The living hinge 365 may thus include the groove 3652 provided in the rear surface and extending in the horizontal direction such that the bending deformation in the forward direction gets easy. The groove 3652 may be cut in a V shape as shown in FIG. 11.

A plurality of grooves 3652 are arranged side by side in the vertical direction. A first group of the grooves 3652 may have a cross-section of a trapezoidal shape. A second group of the grooves 3652 may have a cross-section of a rectangular shape. Multiple grooves 3652 may be filled with a rigid rib 3653 for the rigidity of the living hinge 365. The rigid rib 3653 may be inserted in the grooves 3652 of the first group only, the second group only or both groups. The rigid rib 3653 may be inserted between adjacent two of the plurality of grooves 3652 for the rigidity of the living hinge 365. The rigid rib 3653 may include a metal material. The rigid rib 3653 may be inserted into the groove 3652 between the elastic members 3651, or may be formed integrally with the elastic member 3651 in a double injection scheme.

The rigid rib 3653 may have a length corresponding to a length in the horizontal direction of the display panel 151, but as shown in FIG. 11(b), a plurality of rigid ribs 3653 cut to have a predetermined length may be arranged in the horizontal direction. In this regard, when an end of the rigid rib 3653 is disposed so as to be misaligned with an end of the adjacent rigid rib 3653 in the vertical direction, a degree of freedom in a length change in the vertical direction is increased, so that the bending deformation of the display panel 151 may be performed more smoothly.

Figure 12:
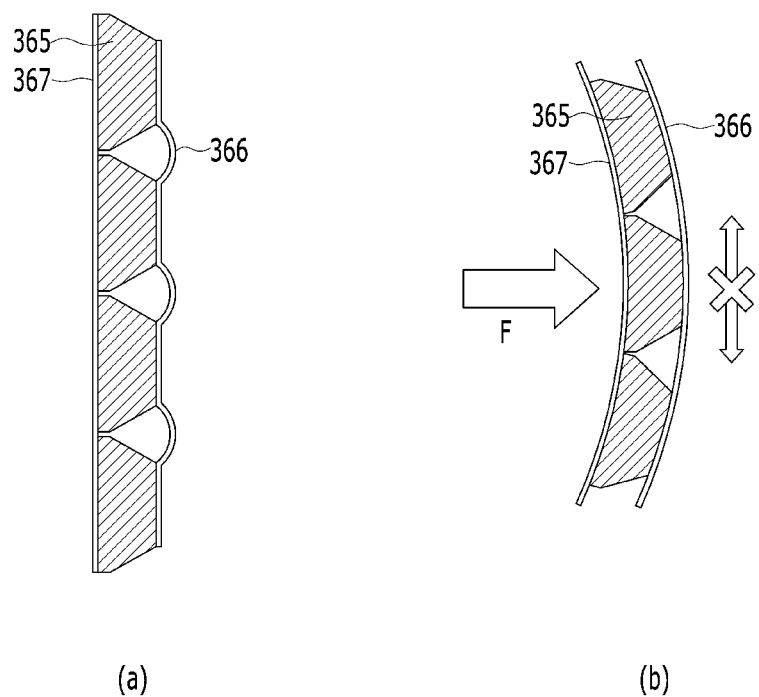
FIG. 12 is a diagram showing a living hinge and a sheet of a display device according to an embodiment of the present disclosure.

FIG. 12 is a diagram showing the living hinge 365, the front sheet 367, and the sheet 366 of the display device 10. FIG. 12(a) shows the first state in which the variable portion B forms the flat surface, and FIG. 12(b) shows the second state in which the variable portion B is bent to form the curved surface.

Since the living hinge 365 has a predetermined thickness, front and rear surfaces of the living hinge 365 have different radius of curvatures. Further, since the front surface of the living hinge 365 is coupled with the display panel 151, a change in the length of the rear surface of the living hinge 365 is greater than a change in the length of the front surface of the living hinge 365.

The front sheet 367 may be coupled to the display panel 151, may have adhesiveness, and may be hardly deformed or slightly expanded. The sheet 366 located on a rear surface of the living hinge 365 has to be able to conform a great change in the length a lot as the living hinge 365 is greatly deformed.

Therefore, the sheet located on the rear surface of the living hinge 365 may be made of a material having great elasticity. However, it is desirable to use the sheet 366 whose length does not change in order to limit a maximum curvature of the bending deformation of the display assembly 100.

As shown in FIG. 12(b), a length in the vertical direction of the sheet 366 is determined corresponding to the curvature in the second state, and the sheet 366 is tightly attached to the rear surface of the living hinge 365 in the state in which the variable portion B is bent.

In this regard, the sheet 366 may be attached or bonded only to the bar (the rigid rib 3653) between the grooves 3652 without being attached to the groove 3652. When switching to the first state as shown in FIG. 12(a), a width of the groove 3652 in the rear surface of the living hinge 365 narrows, so that the unbonded portion of the sheet 366 corresponding to the groove 3652 may become bent and protrude rearwardly (or may be inserted between the grooves 3652) and form with wrinkle.

When switching back to the second state, even when an external force is applied from the front of the living hinge 365 to further change the curvature of the variable portion B, the sheet 366 does not stretch substantially, so that the variable portion B can be reliably supported not to be bent any further.

Figure 13:
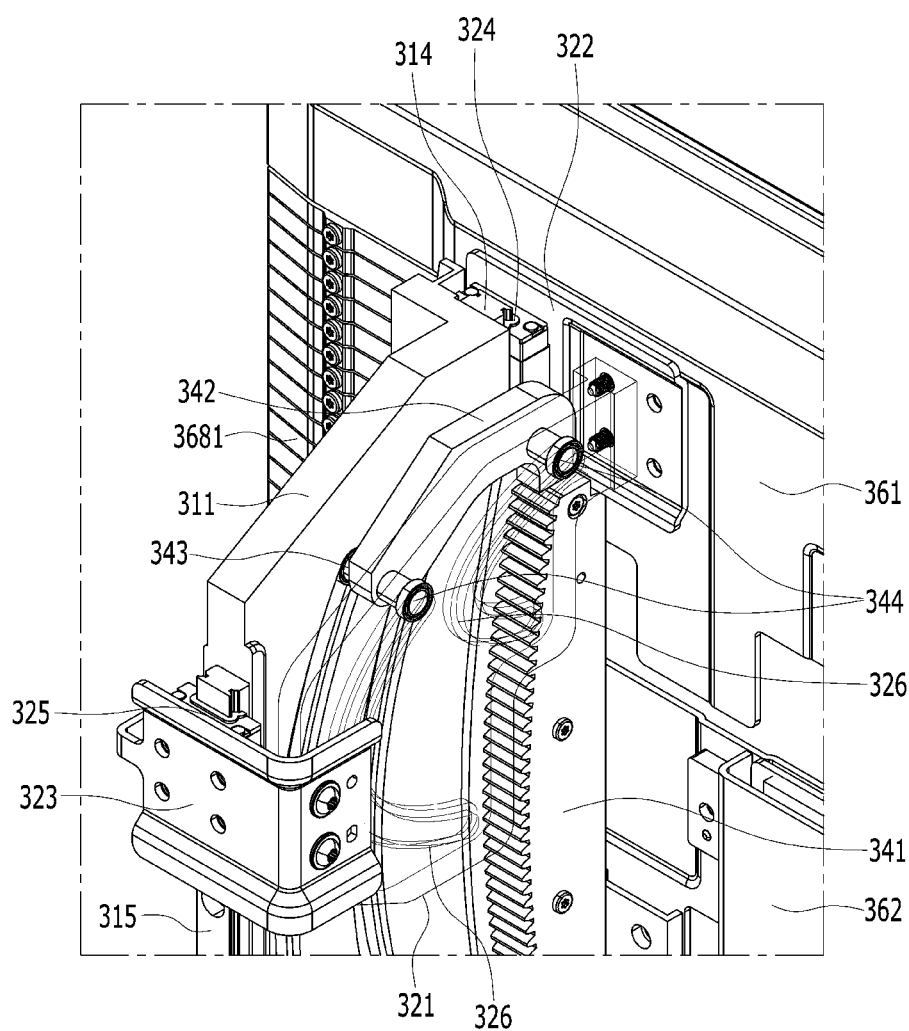
FIG. 13 is a plan view showing moving units of a display device according to an embodiment of the present disclosure.

FIG. 13 is a plan view showing the moving units 320 and 340 of the display device 10. The vertical base 311 of the fixing unit 310, and the moving plate 321, the first front bracket 322, and the rear bracket 323 of the straight-moving unit 320 are shown. The lower arm 341 may include the curved rack gear 341a formed on the rear surface thereof. The upper arm 342 may be coupled onto the lower arm 341.

The curved-moving unit 340 is located in the space between the moving plate 321 and the vertical base 311. The curved rails 312 and 326 facing the upper arm 342 are formed on both the vertical base 311 and the moving plate 321, and the upper arm 342 of the curved-moving unit 340 is coupled to the vertical base 311 and the moving plate 321 at the same time using the guide protrusions 343 and 344 protruding from both sides of the upper arm 342.

Figure 14:
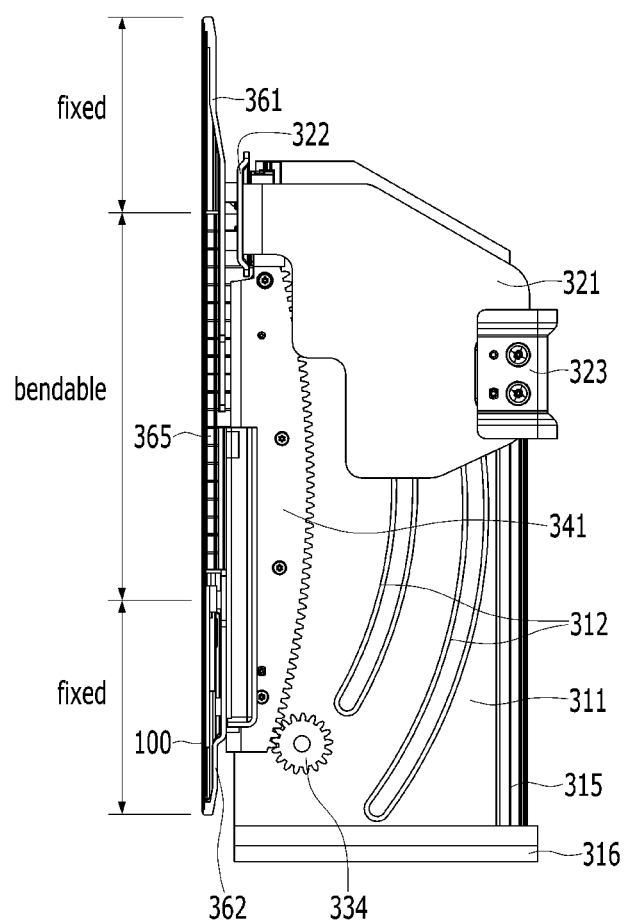
FIG. 14 is a cross-sectional view taken along a line A-A in FIG. 4.

FIG. 14 is a cross-sectional view taken along a line A-A in FIG. 4, and FIG. 15 is a cross-sectional view taken along a line A'-A' in FIG. 7. FIGS. 14 and 15 are views viewed from the outside of the moving plate 321. When the motor 331 is driven and the pinion gear 334 rotates, the curved rack gear 341a is pushed downward and forward, so that the lower portion F2 protrudes forward and downward as shown in FIG. 15.

Because the lower portion F2 moves downward, the variable portion B and the upper portion F1 may also be pulled downward, and the straight-moving unit 320 may also move downward as shown in FIG. 15.

Figure 16:
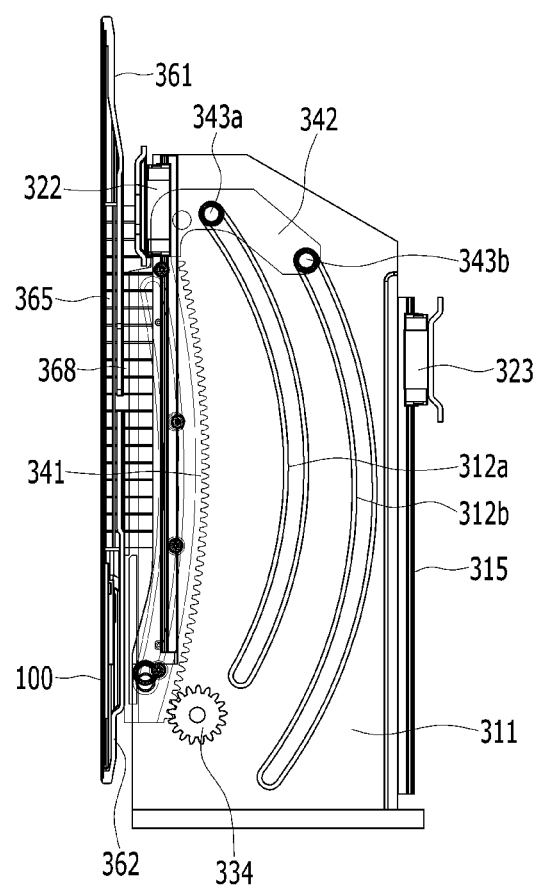
FIG. 16 is a cross-sectional view taken along a line B-B in FIG. 4.
Figure 17:
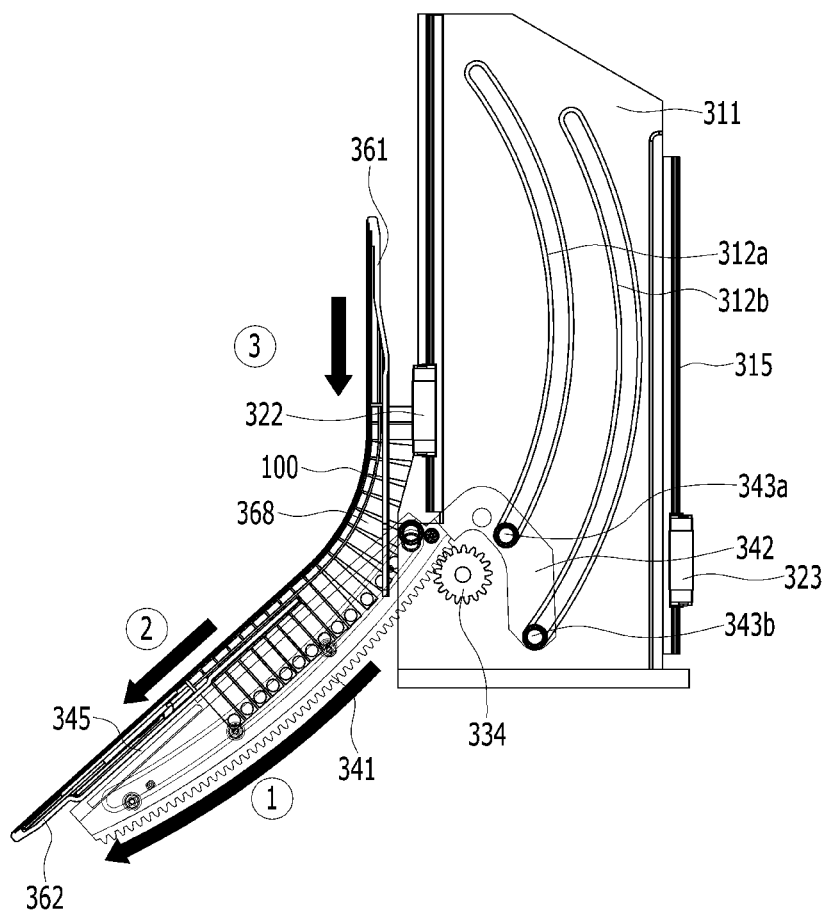
FIG. 17 is a cross-sectional view taken along a line B'-B' in FIG. 7.

FIG. 16 is a cross-sectional view taken along a line B-B in FIG. 4 and FIG. 17 is a cross-sectional view taken along a line B'-B' in FIG. 7. FIG. 17 is a view of the upper arm 342 viewed from the inside of the moving plate 321. The upper arm 342 and the first curved rail 312 formed on the vertical base 311 are shown. The first guide protrusion 343 formed on the upper arm 342 may be inserted into and move along the first curved rail 312. The first curved rail 312 thus guide the moving of the curved-moving unit 340.

As shown in FIGS. 16 and 17, a pair of first curved rails 312 may be disposed in a front and rear direction, and a rear first curved rail 312b located at the rear may have a greater length than a front first curved rail 312a located at the front. This is because, as the upper arm 342 rotates while drawing a curved line, a rear first guide protrusion 343b located at an end portion of the upper arm 342 has a greater rotation radius than a front first guide protrusion 343a, and thus, has a greater moving distance.

The upper arm 342 in FIG. 17 may be more tilted than in FIG. 16 such that a rear portion of the upper arm 342 may be located lower than a front portion of the upper arm 342. The relative position between the lower ends of the first curved rails 312 may be different from the relative position between the upper ends thereof.

When the curved-moving unit 340 moves downward and forward (1), the lower portion F2 moves downward (2), and the variable portion B and the upper portion F1 also move downward (3). If a driving force for moving the upper portion F1 and the straight-moving unit 320 is transmitted via the display assembly 100, a significant load is applied to the display assembly 100, so that there would be a risk of damage to the display panel. In addition, since the straight-moving unit 320 must be pushed up when switching from the second state to the first state, the transmission of the driving force is not smoother than when switching from the first state to the second state.

Accordingly, the second curved rail 326 may be formed on the moving plate 321 and the curved-moving unit 340 may further include the second guide protrusion 344 that is inserted into the second curved rail 326. Thus, the curved-moving unit 340 and the straight-moving unit 320 are directly coupled to each other via the moving plate 321 and the first and second guide protrusions 343, 344. This structure enables the driving force applied to the curved-moving unit 340 to be effectively transmitted to the straight-moving unit 320. The second guide protrusion 344 may be formed on an opposite side of the first guide protrusion 343.

Figure 18:
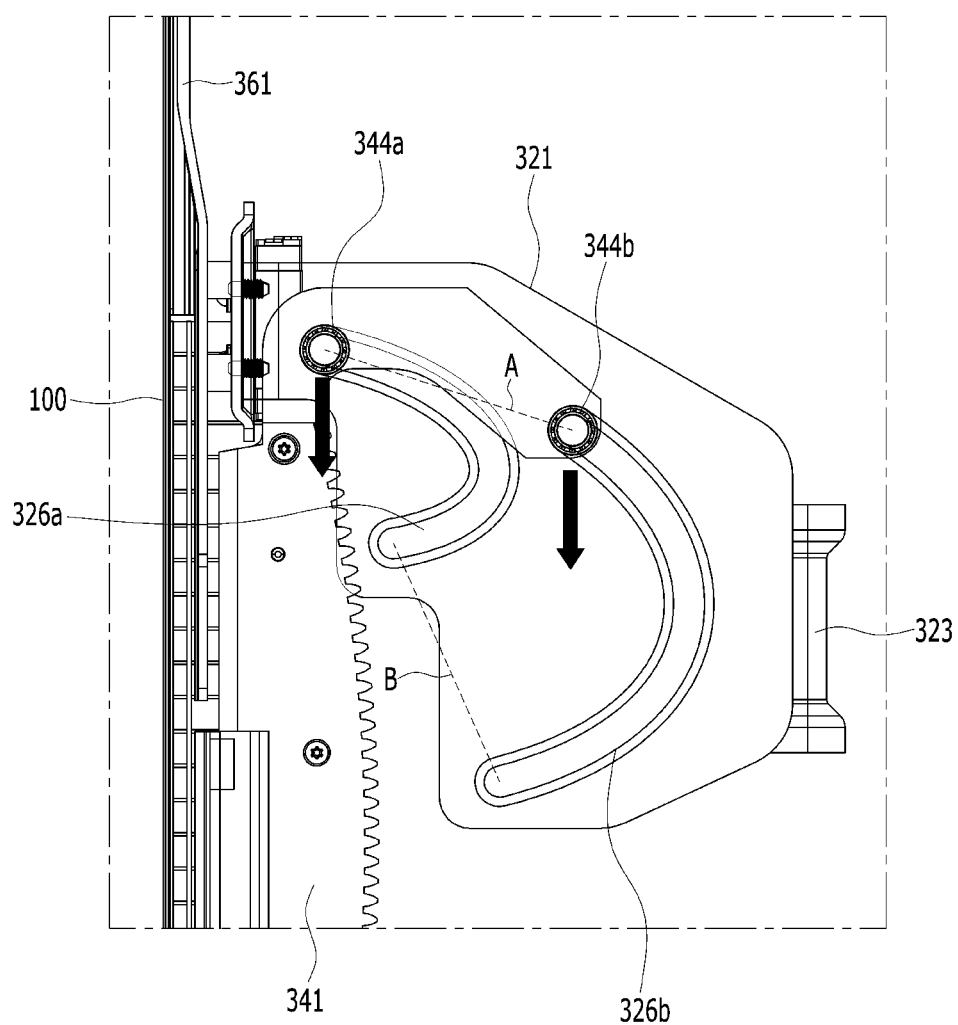
FIGS. 18 to 20 are diagrams showing sliding operations of a straight-moving unit and a curved-moving unit of a display device according to an embodiment of the present disclosure.
Figure 19:
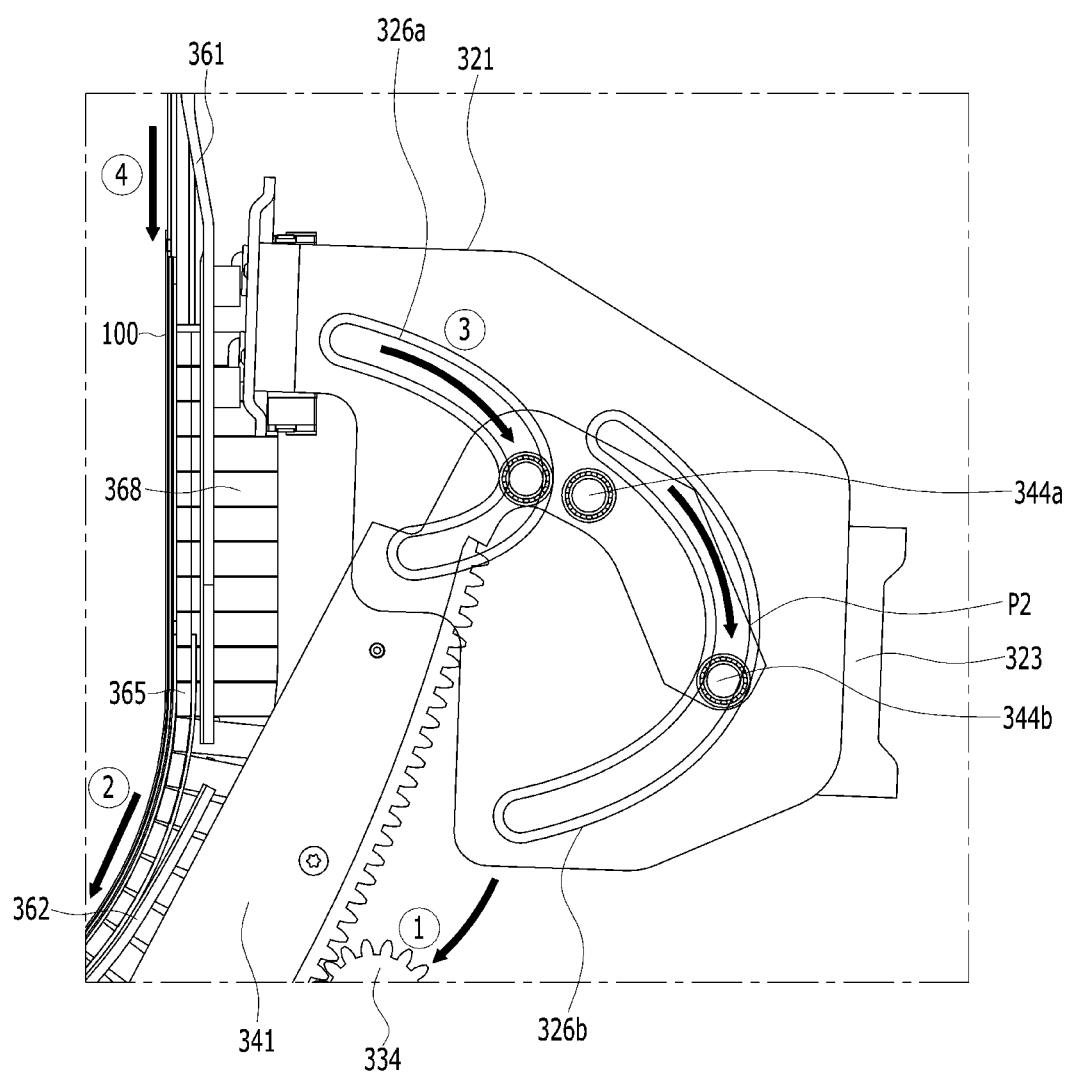
Figure 20:
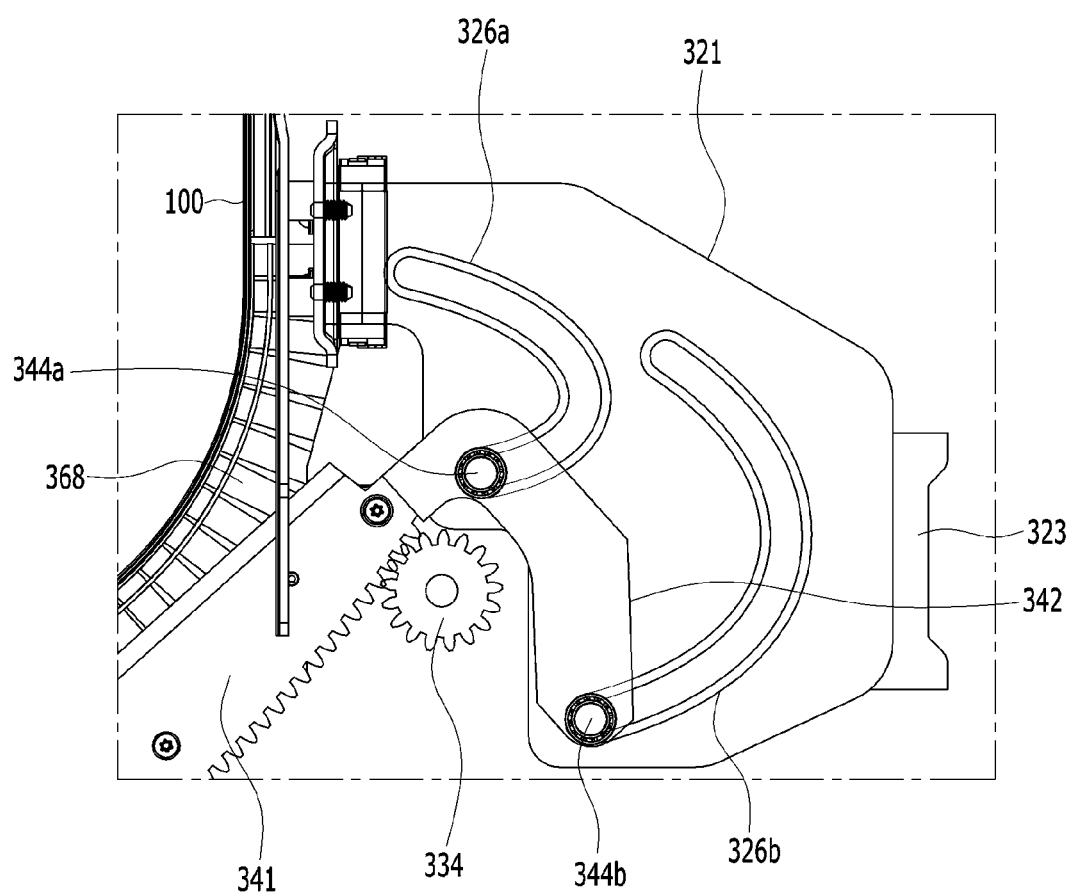

FIGS. 18 to 20 are diagrams showing sliding operations of the straight-moving unit 320 and the curved-moving unit 340 of the display device 10. FIG. 18 is a cross-sectional view taken along a line C-C in FIG. 4, FIG. 20 is a cross-sectional view taken along a line C-C' in FIG. 7, and FIG. 19 is a cross-sectional view showing the straight-moving unit 320 and the curved-moving unit 340 at an intermediate position between the first state and the second state.

Since the upper arm 342 connected onto the lower arm 341 is connected to the moving plate 321, which is the straight-moving unit 320, via the second guide protrusion 344 and the second curved rail 326, the upper arm 342 may effectively transmit a force for pulling the moving plate 321 downward.

However, since the curved-moving unit 340 moves while drawing the curved line and the straight-moving unit 320 moves in a straight line in the vertical direction, the second curved rail 326 may be designed to offset a horizontal movement of the curved-moving unit 340 via the second curved rail 326 and transfer a force in the vertical direction to the moving plate 321.

A pair of second curved rails 326 may be included as shown in FIG. 18, which may be a front second curved rail 326a located at the front and a rear second curved rail 326b located at the rear. The second guide protrusion 344 formed on the upper arm 342 may also include a front second guide protrusion 344a moving along the front second curved rail 326a and a rear second guide protrusion 344b moving along the rear second curved rail 326b.

Since the curved-moving unit 340 moves while rotating, tilted angles of the upper arm 342 vary from the first state to the second state, as shown in FIGS. 18 and 20. Since the curved-moving unit 340 protrudes while being tilted forward in the second state, the upper arm 342 constituting an upper side of the curved-moving unit 340 is tilted more vertically than in the first state.

Therefore, in response to the angle change of the upper arm 342, a line B for connecting a lower end of the front second curved rail 326a and a lower end of the rear second curved rail 326b to each other is steeper than a line A for connecting an upper end of the front second curved rail 326a and an upper end of the rear second curved rail 326b to each other.

Both of the straight-moving unit 320 and the curved-moving unit 340 move in the vertical direction, but moving distances of upper and lower sides of the curved-moving unit 340 are different from each other. The lower side of the curved-moving unit 340 has a smaller vertical moving distance than the straight-moving unit 320, but protrudes further forward instead. The upper side of the curved-moving unit 340, e.g. the second guide protrusion 344, may have a greater vertical moving distance than the straight-moving unit 320.

Since the curved-moving unit 340 performs the vertical movement and the rotational movement at the same time, from a point where the curved-moving unit 340 is engaged with the pinion gear 334, the vertical moving distances of the lower and upper ends are different from each other.

Therefore, the second curved rail 326 reflects a difference in motion trajectory between the straight-moving unit 320 and the curved-moving unit 340, and thus, has a convex shape protruding rearwardly. The first curved rail 312 is formed on the vertical base 311 and is long, but the second curved rail 326 is formed on the moving plate 321 moving in the vertical direction and is shorter than the first curved rail 312.

Peak points (or points of inflexion) P1 and P2 protruding rearward in the second curved rail 326 are different between the front second curved rail 326a and the rear second curved rail 326b. When the peak point P1 of the front second curved rail 326a and the peak point P2 of the rear second curved rail 326b are the same, it is difficult for the second guide protrusion 344 to move while changing a direction thereof (changing the direction to the forward direction) when arriving at the peak points P1 and P2.

When the rear second guide protrusion 344b reaches the peak of the rear second curved rail 326b, the front second curved rail 326a is still moving downward. Thus, the rear second guide protrusion 344b may pass the peak point P2 at the rear second curved rail 326b and move along the rear second curved rail 326b tilted forward.

As shown in FIG. 19, when the front second guide protrusion 344a reaches the peak point P1 of the front second curved rail 326a, the upper arm 342 may move downward by a force of the rear second curved rail 326b moving downward, and the front second guide protrusion 344a may continue to move downward along the front second curved rail 326a.

In addition, the front second curved rail 326a may have a larger curvature than the rear second curved rail 326b. The front second curved rail 326a may have a smaller distance between its upper and lower ends than the rear second curved rail 326b. That is, a radius of curvature of the rear second curved rail 326b may be larger than a radius of curvature of the front second curved rail 326a, and a length of the rear second curved rail 326b may be greater than a length of the front second curved rail 326a. This is because a portion coupled to the lower arm 341, e.g. the front second guide protrusion 344a, and an end of the upper arm 342, e.g. the rear second guide protrusion 344b, have different moving trajectories.

When the second guide protrusion 344 arrives at a lower end of the second curved rail 326, the first guide protrusion 343 also reaches a lower end of the first curved rail 312 and the state is switched to the second state. In the second state, the upper arm 342 may be steeper than in the first state and the lower arm 341 may protrude forward and may be tilted at an angle from the vertical direction.

Conversely, when the display assembly 100 moves upward reversely, the lower arm 341 may change in angle while moving upward, and the upper arm 342 may move along the second curved rail 326 and push the moving plate 321 upward, so that the upper portion of the display assembly 100 may move upward.

As such, a driving force of the curved-moving unit 340 may be directly transmitted to the straight-moving unit 320 via the second curved rail 326 to induce the upward movement of the display assembly 100, thereby achieving the movement more stable than a structure of transferring a force to the straight-moving unit 320 via the display assembly 100.

At least a part of the display device illustrated in the drawings may be disposed in the dashboard in the manner that a portion of the display assembly 100 is hidden inside the dashboard in the first state of the display device 100 and protrudes from the dashboard in the second state of the display device. The area of the protruded portion of the display assembly 100 may be adjusted suitable for information to be presented on the protruded portion. Power may be supplied only to the protruded portion of the display assembly 100 not to all of the display assembly 100. This contributes to saving power consumption of the display device.

As explained above, the mechanism of the embodiment illustrated in the drawings guides the upper portion F1 of the display assembly 100 to move vertically and the lower portion F2 of the display assembly 100 to move downward and forward at the same time. In this illustrated mechanism, the curved-moving unit 340 and the straight-moving unit 320 are directly coupled to each other as explained above. Due to these functional and structural features of this illustrated mechanism, each of the curved-moving unit 340 and the straight-moving unit 320 have to include multiple components and somewhat complicated structures.

In a first alternative mechanism (not illustrated in the drawings), the curved-moving unit 340 may be not directly coupled to the straight-moving unit 320, the driving unit may provide the power directly to the curved-moving unit 340, and the straight-moving unit 340 may be pulled/pushed and forced to move by the pulling/pushing force of the lower portion F2. As a variation of this first alternative mechanism, the driving unit may provide the power directly to the straight-moving unit 320, not to the curved-moving unit 340. Then, the curved-moving unit 340 may be forced to move in accordance with the moving of the upper portion by the pulling/pushing force of the upper portion. In a second alternative mechanism (not illustrated in the drawings), the curved-moving unit 340 may be not directly coupled to the straight-moving unit 320, and the curved-moving unit 340 and the straight-moving unit 320 are moved by two independent driving units 330. In a third alternative mechanism (not illustrated in the drawings), the moving unit 340 may include the curved-moving unit 340 only, not the straight-moving unit 320, which enables, at the second state, the lower portion F2 of the display assembly 100 to have a higher curvature and the upper portion F1 of the display assembly 100 to have a lower curvature.

In these alternative mechanisms, the curved-moving unit 340 and the straight-moving unit 320 may need much less components. For instance, in the first alternative mechanism, the curved-moving unit 340 may only include the lower arm 341 having an element to receive power from the driving unit 330, and the straight-moving unit 320 may include the first front bracket 322 and the first guide block 324. In the second alternative mechanism, the curved-moving unit 340 may only include the lower arm 341 having an element to receive power from the driving unit 330, and the straight-moving unit 320 may include the first front bracket 322, the first guide block 324 and an element to receive power from an additional driving unit. In the second alternative mechanism, the curved-moving unit 340 may only include the lower arm 341 which has an element to receive power from the driving unit 330 and extends substantially up to the upper portion F1 of the display assembly 100.

Figure 21:
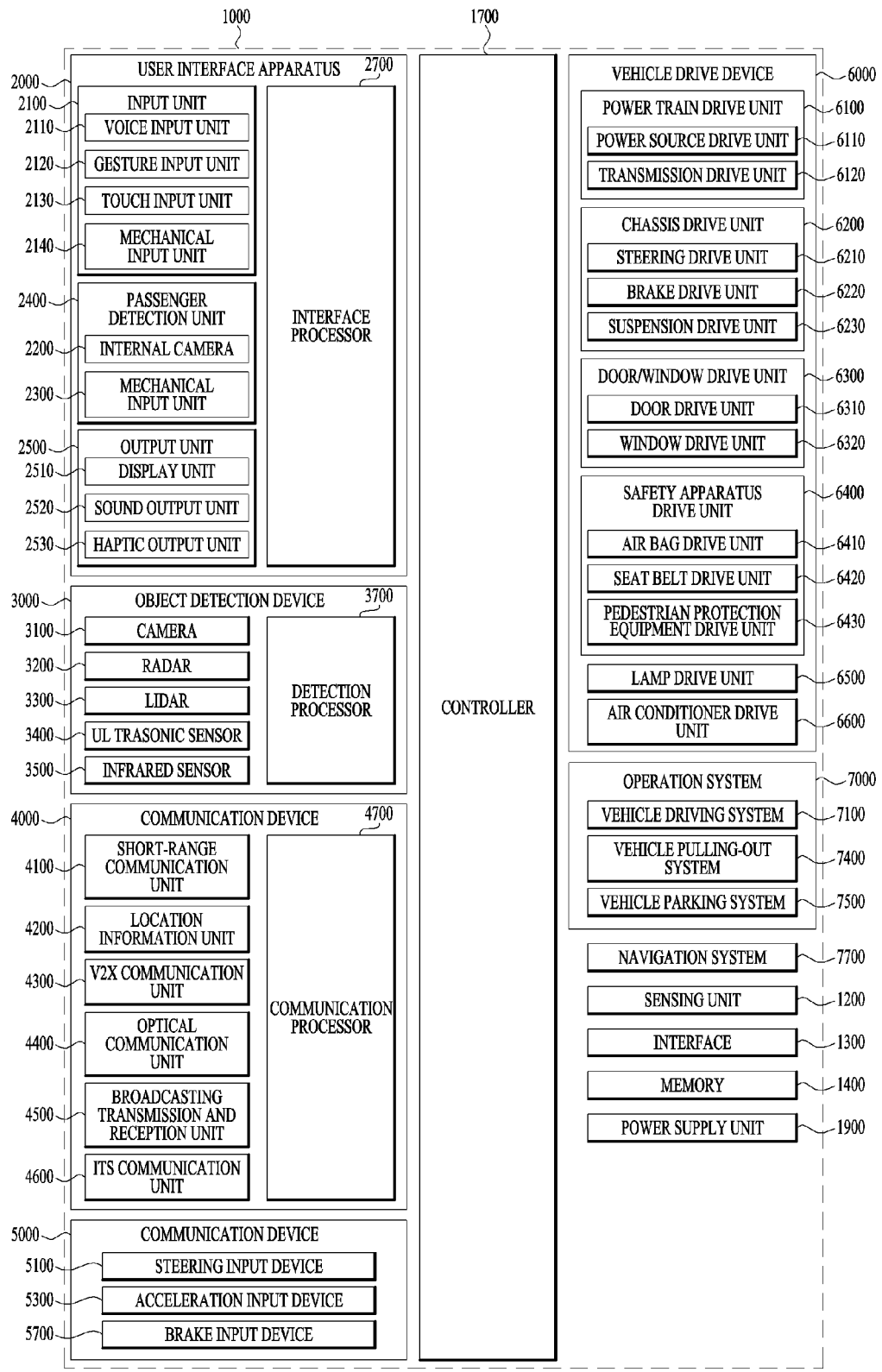
FIG. 21 is a block diagram for explaining a vehicle to which the display device according to the present disclosure can be applied.

FIG. 21 is a block diagram for explaining the vehicle to which the display device of the present invention can be applied.

The vehicle 1000 may include a user interface apparatus 2000. The user interface apparatus 2000 is an apparatus for communication between the vehicle and a user, e.g. a driver. The user interface apparatus 2000 may receive a user input and provide information generated in the vehicle to the user. The user interface apparatus 2000 may include an input unit 2100, an internal camera 2200, a biometric sensing unit 2300, an output unit 2500 and a processor 2700.

The user interface apparatus 2000 may include a plurality of processors 2700 or may not include any processor 2700. When the processor 2700 is not included in the user interface apparatus 2000, the user interface apparatus 2000 may operate according to a control of a processor of another apparatus within the vehicle 1000 or a main controller 1700. Meanwhile, the user interface apparatus 2000 may operate according to the control of the main controller 1700.

The display device of the present invention may correspond to the user interface apparatus 2000 and thus may operate according to an input signal provided from the controller 1700 or at least one of the other devices or units in the vehicle.

The vehicle may further comprise a sensing unit 1200 which can sense various states of the vehicle. The sensing unit 120 may include different kinds of sensors. The sensing unit 1200 may acquire sensing signals with respect to vehicle-related information, such as a posture, a collision, an orientation, a position (GPS information), an angle, a speed, an acceleration, a tilt, a forward/backward movement, a battery, a fuel, tires, lamps, internal temperature, internal humidity, a rotated angle of a steering wheel, external illumination, pressure applied to an accelerator, pressure applied to a brake pedal and the like. An input signal indicating a state of the vehicle sensed by the sensing unit 1200 may be provided to the display device.

The vehicle may further comprise the main controller 1700. The main controller 1700 can control a vehicle operating apparatus 6000 for electrically controlling operations of various devices within the vehicle and/or control an operation system 7000 for controlling various driving modes of the vehicle. An input signal indicating a state of the vehicle corresponding to the operations of various devices within the vehicle and/or the various driving modes of the vehicle may be also provided to the display device.

The display device of the present invention may change its shape according to this input signal received.

As an embodiment, when the display device receives an input signal indicating that the vehicle is in use (for instance, a door of the vehicle is being opened, a person is sitting on a driver's seat, the car engine or motor is turned on, or the vehicle is in motion), the display device may become bent, and otherwise the display device may become flat. Since the display device changes its shape according to a state of the vehicle, users can notice a current state of the vehicle in a simple and intuitive way from the shape of the display device. In addition, this bent shape of the display device provides the advantage of not obstructing a driver's view forward through the wind shield. Further, since a particular region in a screen of the bent display device may provide a convenient view angle for the driver, that particular region may be utilized to effectively deliver information on a current state of the vehicle even by a driver's glance at the display device.

Alternatively, the display device of the present invention may change its shape according to an input signal indicating driving modes. For instance, when the display device receives an input signal indicating that the vehicle is on a manual mode, the display device may become bent, and otherwise (e.g. an autonomous mode or an assisted mode) the display device may become flat. In the manual mode, the driver has to carefully look forward through the wind shield and at the same time watch the display device to get driving information quickly. The bent display device can be more beneficial in this manual mode since the bent display device does not obstruct the driver's view and a particular region of the bent display device can provide a more convenient view angle for the driver.

As a variation, the opposite is also possible. That is, when the display device receives an input signal indicating that the vehicle is on a manual mode, the display device may become flat, and otherwise the display device may become bent. This variation also provides the advantage that the driver can quickly notice and react to the change from an autonomous or assisted mode to a manual mode on the basis of the shape of the display device.

Alternatively, the display device of the present invention may change its shape according to an input signal indicating a state of the gear box. For instance, when the display device receives an input signal indicating that the gear box is in the 'Drive' (D) state, the display device may become bent, and otherwise when the display device receives an input signal indicating that the gear box is in the 'Rearward' (R) state, the display device may become flat. Some variations are also possible. As an example, the display device may become bent when the gear box is in the either 'Parking' (P) or 'Rearward' (R) state. This alternative embodiment provides the advantage that the driver can quickly and intuitively notice the state of the gear box without carefully looking at a gear selector or a screen providing information on the state of the gear box.

The invention claimed is:

1. A display device for a vehicle, comprising:
   a fixing unit;
   a moving unit movably coupled to the fixing unit and configured to switch a state of the display device from a first state to a second state; and
   a display assembly coupled to the moving unit, configured to move together with the moving unit, and including a variable portion, wherein the variable portion becomes flat in the first state and bent in the second state,
   wherein the display assembly includes:
   a flexible display panel;
   a living hinge located on a rear surface of the flexible display panel and capable of being deformed corresponding to the bending of the variable portion; and
   a sheet coupled to a rear surface of the living hinge and configured to limit a maximum bending curvature of the variable portion while covering a plurality of grooves, and
   wherein the sheet is formed with wrinkles in the first state and is unfolded in the second state.

2. The display device of claim 1, wherein the living hinge includes the plurality of grooves extending in a horizontal direction in the rear surface thereof and arranged side by side in a vertical direction, and
   wherein the wrinkles of the sheet are formed at positions corresponding to the plurality of grooves.

3. The display device of claim 2, further comprising:
   a plurality of rigid ribs located between the plurality of grooves and extending in the horizontal direction.

4. The display device of claim 3, wherein the plurality of rigid ribs are arranged so as to be spaced apart from each other while defining a predetermined gap therebetween in the horizontal direction, and
   wherein ends of rigid ribs adjacent to each other in the vertical direction are misaligned with each other.

5. The display device of claim 4, wherein the fixing unit includes:
   a vertical base extending in the vertical direction; and
   a side rail formed at a front portion of a side surface of the vertical base and having a lower end extending while protruding forward.

6. The display device of claim 3, wherein the sheet is attached only to rigid ribs of the plurality of the rigid ribs between the plurality of grooves.

7. The display device of claim 3, wherein the fixing unit includes:
   a vertical base extending in the vertical direction; and
   a side rail formed at a front portion of a side surface of the vertical base and having a lower end extending while protruding forward.

8. The display device of claim 2, wherein the living hinge contains an elastic material, and the plurality of grooves have a V-shaped cross-section.

9. The display device of claim 8, wherein the fixing unit includes:
   a vertical base extending in the vertical direction; and
   a side rail formed at a front portion of a side surface of the vertical base and having a lower end extending while protruding forward.

10. The display device of claim 2, wherein the fixing unit includes:
a vertical base extending in the vertical direction; and
a side rail formed at a front portion of a side surface of the vertical base and having a lower end extending while protruding forward.

11. The display device of claim 1, wherein the fixing unit includes:
a vertical base extending in a vertical direction; and
a side rail formed at a front portion of a side surface of the vertical base and having a lower end extending while protruding forward.

12. The display device of claim 11, further comprising a hinge wing portion protruding from the rear surface of the living hinge and moving along the side rail.

13. The display device of claim 12, wherein the hinge wing portion includes a plurality of hinge wing portions arranged in the vertical direction.

14. The display device of claim 13, wherein the vertical base includes a pair of vertical bases arranged in a horizontal direction,
wherein the side rail includes a pair of side rails formed on opposite sides of the pair of vertical bases, respectively, and
wherein the hinge wing portion includes a pair of hinge wing portions disposed in a bilaterally symmetrical manner and coupled to the pair of side rails for guiding the variable portion.

15. The display device of claim 12, wherein the vertical base includes a pair of vertical bases arranged in a horizontal direction,
wherein the side rail includes a pair of side rails formed on opposite sides of the pair of vertical bases, respectively, and
wherein the hinge wing portion includes a pair of hinge wing portions disposed in a bilaterally symmetrical manner and coupled to the pair of side rails for guiding the variable portion.

16. The display device of claim 1, wherein the display assembly further includes:
an upper planar portion located on an upper side of the variable portion and having no change in a curvature; and
a lower planar portion located on a lower side of the variable portion and having no change in a curvature, and
wherein the display device further includes:
a first back plate coupled to a rear surface of the upper planar portion; and
a second back plate coupled to a rear surface of the lower planar portion.

17. The display device of claim 16, wherein the first back plate includes a first extension fixed to the upper planar portion and covering at least a portion of the living hinge,
wherein the second back plate includes a second extension fixed to the lower planar portion and covering at least a portion of the living hinge, and
wherein the first extension and the second extension do not overlap each other.

18. The display device of claim 16, wherein the moving unit includes:
a straight-moving unit vertically moving with respect to the fixing unit and coupled to the first back plate; and
a curved-moving unit protruding forward and downward while drawing a curved line with respect to the fixing unit when the state is switched from the first state to the second state, and coupled to the second back plate, and
wherein, in the second state, the display assembly becomes bent with a lower portion thereof protruding forward.

19. The display device of claim 18, further comprising a driver for providing power to the curved-moving unit,
wherein the curved-moving unit includes:
a lower arm including a curved rack gear engaged with a pinion gear of the driver; and
an upper arm coupled to an upper end portion of the lower arm and providing power to the straight-moving unit.

20. The display device of claim 1, wherein the living hinge includes the plurality of grooves on the rear surface thereof.

* * * * *